(12) United States Patent
Yoshizumi et al.

(10) Patent No.: US 7,933,303 B2
(45) Date of Patent: Apr. 26, 2011

(54) GROUP-III NITRIDE SEMICONDUCTOR LASER DEVICE, AND METHOD FOR FABRICATING GROUP-III NITRIDE SEMICONDUCTOR LASER DEVICE

(75) Inventors: Yusuke Yoshizumi, Itami (JP); Yohei Enya, Itami (JP); Takashi Kyono, Itami (JP); Masahiro Adachi, Osaka (JP); Katsushi Akita, Itami (JP); Masaki Ueno, Itami (JP); Takamichi Sumitomo, Itami (JP); Shinji Tokuyama, Itami (JP); Koji Katayama, Itami (JP); Takao Nakamura, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/844,446

(22) Filed: Jul. 27, 2010

(65) Prior Publication Data

US 2010/0322276 A1    Dec. 23, 2010

Related U.S. Application Data

(63) Continuation of application No. PCT/JP2009/062895, filed on Jul. 16, 2009.

(30) Foreign Application Priority Data

Jun. 17, 2009   (JP) ............................... P2009-144442

(51) Int. Cl.
*H01S 5/00* (2006.01)
(52) U.S. Cl. .............. 372/44.011; 372/43.01; 372/44.01
(58) Field of Classification Search ............. 372/44.011, 372/43.01, 44.01
See application file for complete search history.

(56) References Cited

U.S. PATENT DOCUMENTS 6,356,572 B1 * 3/2002 Tanaka et al. .............. 372/45.01
(Continued)

FOREIGN PATENT DOCUMENTS

JP    2001-230497 A    8/2001
(Continued)

OTHER PUBLICATIONS

Nakamura, S. et al. "InGaN-Based Multi-Quantum-Well-Structure Laser Diodes," Japanese Journal of Applied Physics, Jan. 15, 1996, pp. 74-76, vol. 35, Part 2.
(Continued)

*Primary Examiner* — Minsun Harvey
*Assistant Examiner* — Joshua King
(74) *Attorney, Agent, or Firm* — Venable LLP; Michael A. Sartori; Leigh D. Thelen

(57) ABSTRACT

Provided is a group-III nitride semiconductor laser device with a laser cavity allowing for a low threshold current, on a semipolar surface of a support base in which the c-axis of a hexagonal group-III nitride is tilted toward the m-axis. First and second fractured faces 27, 29 to form the laser cavity intersect with an m-n plane. The group-III nitride semiconductor laser device 11 has a laser waveguide extending in a direction of an intersecting line between the m-n plane and the semipolar surface 17a. For this reason, it is feasible to make use of emission by a band transition enabling the low threshold current. In a laser structure 13, a first surface 13a is opposite to a second surface 13b. The first and second fractured faces 27, 29 extend from an edge 13c of the first surface 13a to an edge 13d of the second surface 13b. The fractured faces are not formed by dry etching and are different from conventionally-employed cleaved facets such as c-planes, m-planes, or a-planes.

20 Claims, 16 Drawing Sheets

U.S. PATENT DOCUMENTS

| | | | |
|---|---|---|---|
| 6,680,959 B2 * | 1/2004 | Tanabe et al. | 372/45.01 |
| 7,501,667 B2 | 3/2009 | Hasegawa et al. | |
| 2005/0185687 A1 * | 8/2005 | Ohgoh | 372/43.01 |
| 2005/0269584 A1 | 12/2005 | Hasegawa et al. | |
| 2008/0230766 A1 | 9/2008 | Okamoto et al. | |
| 2008/0308906 A1 * | 12/2008 | Osada et al. | 257/615 |
| 2009/0059983 A1 | 3/2009 | Hasegawa et al. | |

FOREIGN PATENT DOCUMENTS

| | | |
|---|---|---|
| JP | 2005-353690 | 12/2005 |
| JP | 2007-184353 | 7/2007 |
| JP | 2008-235804 A | 10/2008 |
| JP | 2009-081336 | 4/2009 |

OTHER PUBLICATIONS

Asamizu, H. et al. "Demonstration of 426nm InGaN/GaN Laser Diodes Fabricated on Free-Standing Semipolar (1122) Gallium Nitride Substrates," Applied Physics Express 1, Aug. 29, 2008, pp. 091102-1-091102-3.

Yamaguchi, A. "Anisotropic Optical Matrix Elements in Strained GaN Quantum Wells on Semipolar and Nonpolar Substrates," Japanese Journal of Applied Physics, Aug. 17, 2007, pp. L789-L791, vol. 46, No. 33.

Okamoto, K. et al. "Nonpolar $m$-plane InGaN Multiple Quantum Well Laser Diodes With a Lasing Wavelength of 499.8 nm," Applied Physics Letters, Feb. 18, 2009, pp. 071105-1-071105-3, vol. 94.

* cited by examiner (a)

| HEXAGONAL GaN | | | | | | | | | | |
|---|---|---|---|---|---|---|---|---|---|---|
| a | c | h1 | k1 | l1 | h2 | k2 | l2 | cos θ | Arccos(rad) | (deg) |
| 3.189 | 5.185 | -1 | 0 | 1 | 2 | 0 | 1 | -0.7 | 2.4 | 137.05 |
| 3.189 | 5.185 | -1 | 0 | 2 | 2 | 0 | 1 | -0.5 | 2.1 | 118.28 |
| 3.189 | 5.185 | -1 | 0 | 3 | 2 | 0 | 1 | -0.3 | 1.9 | 107.13 |
| 3.189 | 5.185 | -1 | 0 | 4 | 2 | 0 | 1 | -0.2 | 1.7 | 100.23 |
| 3.189 | 5.185 | -1 | 0 | 5 | 2 | 0 | 1 | -0.1 | 1.7 | 95.67 |
| 3.189 | 5.185 | -1 | 0 | 6 | 2 | 0 | 1 | 0.0 | 1.6 | 92.46 |
| 3.189 | 5.185 | -1 | 0 | 7 | 2 | 0 | 1 | 0.0 | 1.6 | 90.10 |
| 3.189 | 5.185 | -1 | 0 | 8 | 2 | 0 | 1 | 0.0 | 1.5 | 88.29 |
| 3.189 | 5.185 | -1 | 0 | 9 | 2 | 0 | 1 | 0.1 | 1.5 | 86.87 |
| 3.189 | 5.185 | -1 | 0 | 10 | 2 | 0 | 1 | 0.1 | 1.5 | 85.72 |
| 3.189 | 5.185 | -2 | 0 | 1 | 2 | 0 | 1 | -0.9 | 2.6 | 150.17 |
| 3.189 | 5.185 | -2 | 0 | 2 | 2 | 0 | 1 | -0.7 | 2.4 | 137.05 |
| 3.189 | 5.185 | -2 | 0 | 3 | 2 | 0 | 1 | -0.6 | 2.2 | 126.46 |
| 3.189 | 5.185 | -2 | 0 | 4 | 2 | 0 | 1 | -0.5 | 2.1 | 118.28 |
| 3.189 | 5.185 | -2 | 0 | 5 | 2 | 0 | 1 | -0.4 | 2.0 | 111.99 |
| 3.189 | 5.185 | -2 | 0 | 6 | 2 | 0 | 1 | -0.3 | 1.9 | 107.13 |
| 3.189 | 5.185 | -2 | 0 | 7 | 2 | 0 | 1 | -0.2 | 1.8 | 103.30 |
| 3.189 | 5.185 | -2 | 0 | 8 | 2 | 0 | 1 | -0.2 | 1.7 | 100.23 |
| 3.189 | 5.185 | -2 | 0 | 9 | 2 | 0 | 1 | -0.1 | 1.7 | 97.73 |
| 3.189 | 5.185 | -2 | 0 | 10 | 2 | 0 | 1 | -0.1 | 1.7 | 95.67 |
| 3.189 | 5.185 | -3 | 0 | 1 | 2 | 0 | 1 | -0.9 | 2.7 | 155.02 |
| 3.189 | 5.185 | -3 | 0 | 2 | 2 | 0 | 1 | -0.8 | 2.5 | 145.54 |
| 3.189 | 5.185 | -3 | 0 | 3 | 2 | 0 | 1 | -0.7 | 2.4 | 137.05 |
| 3.189 | 5.185 | -3 | 0 | 4 | 2 | 0 | 1 | -0.6 | 2.3 | 129.71 |
| 3.189 | 5.185 | -3 | 0 | 5 | 2 | 0 | 1 | -0.6 | 2.2 | 123.49 |
| 3.189 | 5.185 | -3 | 0 | 6 | 2 | 0 | 1 | -0.5 | 2.1 | 118.28 |
| 3.189 | 5.185 | -3 | 0 | 7 | 2 | 0 | 1 | -0.4 | 2.0 | 113.91 |
| 3.189 | 5.185 | -3 | 0 | 8 | 2 | 0 | 1 | -0.3 | 1.9 | 110.23 |
| 3.189 | 5.185 | -3 | 0 | 9 | 2 | 0 | 1 | -0.3 | 1.9 | 107.13 |
| 3.189 | 5.185 | -3 | 0 | 10 | 2 | 0 | 1 | -0.2 | 1.8 | 104.48 |

PLANE INDICES OF PLANES PERPENDICULAR TO (20-21)

→ (-1016) PLANE
→ (-1017) PLANE
→ (-1018) PLANE

GROUP-III NITRIDE SEMICONDUCTOR LASER DEVICE, AND METHOD FOR FABRICATING GROUP-III NITRIDE SEMICONDUCTOR LASER DEVICE

CROSS REFERENCE TO RELATED APPLICATIONS

This is a continuation of a application PCT application No. PCT/JP2009/062895 filed on Jul. 16, 2009, claiming the benefit of priorities from Japanese Patent applications No. 2009-144442 filed on Jun. 17, 2009, and incorporated by reference in their entirety.

TECHNICAL FIELD

The present invention relates to a group-III nitride semiconductor laser device, and a method of fabricating the group-III nitride semiconductor laser device.

BACKGROUND ART

Non-patent Document 1 describes a semiconductor laser made on a c-plane sapphire substrate. The mirror faces of the semiconductor laser are formed by dry etching. The Document 1 shows micrographs of the laser cavity mirror faces of the laser, and describes that the roughness of the end faces is about 50 nm.

Non-patent Document 2 describes a semiconductor laser formed on a (11-22) plane GaN substrate. The mirror faces of the semiconductor laser are formed by dry etching.

Non-patent Document 3 describes a gallium nitride (GaN)-based semiconductor laser. It proposes generation of laser light polarized in an off direction of the c-axis of the substrate, in order to use m-plane cleaved facets for the laser cavity. Specifically, this Document describes increase of the well thickness on a nonpolar surface and decrease of the well thickness on a semipolar surface.

PRIOR ART DOCUMENTS

Non-Patent Documents

Non-patent Document 1: Jpn. J. Appl. Phys. Vol. 35, (1996) L74-L76
Non-patent Document 2: Appl. Phys. Express 1 (2008) 091102
Non-patent Document 3: Jpn. J. Appl. Phys. Vol. 46, (2007) L789

SUMMARY OF THE INVENTION

Problem to be Solved by the Invention

The band structure of the GaN-based semiconductor has some possible transitions capable of lasing. According to the Inventor's knowledge, it is considered that in the group-III nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the above possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the laser cavity mirrors. For this reason, the laser cavity mirrors have been made heretofore by forming dry-etched facets of semiconductor layers by reactive ion etching (RIE). What is now desired is an improvement in the laser cavity mirrors, which have been formed by RIE, in terms of perpendicularity to the laser waveguide, flatness of the dry-etched facets, or ion damage. It becomes a heavy burden to find process conditions for obtaining excellent dry-etched faces in the current technical level.

As far as the inventor knows, in a single group-III nitride semiconductor laser device formed on the semipolar surface, no one has succeeded heretofore in achieving both of the laser waveguide, which extends in the inclination direction (off direction) of the c-axis, and the end faces for laser cavity mirrors formed without use of dry etching.

The present invention has been accomplished in view of the above-described circumstances. It is an object of the present invention to provide a group-III nitride semiconductor laser device with a laser cavity enabling a low threshold current, on the semipolar surface of a support base that tilts with respect to the c-axis toward the m-axis of a hexagonal group-III nitride. It is another object of the present invention to provide a method of fabricating the group-III nitride semiconductor laser device.

Means for Solving the Problem

A group-III nitride semiconductor laser device according to one aspect of the present invention comprises: (a) a laser structure including a support base comprised of a hexagonal group-III nitride semiconductor and having a semipolar primary surface, and a semiconductor region provided on the semipolar primary surface of the support base; and (b) an electrode provided on the semiconductor region of the laser structure. The semiconductor region comprises a first cladding layer of a first conductivity type gallium nitride-based semiconductor, a second cladding layer of a second conductivity type gallium nitride-based semiconductor, and an active layer provided between the first cladding layer and the second cladding layer. The first cladding layer, the second cladding layer and the active layer are arranged along a normal axis to the semipolar primary surface. The active layer comprises a gallium nitride-based semiconductor layer. The c-axis of the hexagonal group-III nitride semiconductor of the support base tilts at an angle ALPHA with respect to the normal axis toward the m-axis of the hexagonal group-III nitride semiconductor. The laser structure comprises first and second fractured faces which intersect with an m-n plane defined by the m-axis of the hexagonal group-III nitride semiconductor and the normal axis. A laser cavity of the group-III nitride semiconductor laser device comprises the first and second fractured faces. The laser structure comprises first and second surfaces and the first surface is opposite to the second surface. Each of the first and second fractured faces extends from an edge of the first surface to an edge of the second surface.

In this group-III nitride semiconductor laser device, since the first and second fractured faces that form the laser cavity intersect with the m-n plane defined by the normal axis and the m-axis of the hexagonal group-III nitride semiconductor, it is feasible to provide the laser waveguide extending in a direction of an intersecting line between the m-n plane and the semipolar surface. The present invention, therefore, succeeds in providing the group-III nitride semiconductor laser device with the laser cavity that enables a low threshold current.

In the group-III nitride semiconductor laser device according to the present invention, preferably, the angle between the normal axis and the c-axis of the hexagonal group-III nitride semiconductor falls within the range of not less than 45° and not more than 80° or within the range of not less than 100° and not more than 135°.

In this group-III nitride semiconductor laser device, when the angle is in the range of less than 45° and in the range of more than 135°, end faces made by press are highly likely to be comprised of m-planes. When the angle is in the range of more than 80° and less than 100°, it might result in failing to achieve desired flatness and perpendicularity.

In the group-III nitride semiconductor laser device according to the present invention, more preferably, the angle between the normal axis and the c-axis of the hexagonal group-III nitride semiconductor falls within the range of not less than 63° and not more than 80° or within the range of not less than 100° and not more than 117°.

In this group-III nitride semiconductor laser device, when the angle is in the range of not less than 63° and not more than 80° or within the range of not less than 100° and not more than 117°, end faces made by press are highly likely to be faces nearly perpendicular to the primary surface of the substrate. When the angle is in the range of more than 80° and less than 100°, it may result in failing to achieve desired flatness and perpendicularity.

In the group-III nitride semiconductor laser device according to the present invention, a thickness of the support base is not more than 400 μm, which can provide this group-III nitride semiconductor laser device with good-quality fractured facets for the laser cavity.

In the group-III nitride semiconductor laser device according to the present invention, more preferably, the thickness of the support base is not less than 50 μm and not more than 100 μm. When the thickness is not less than 50 μm, the handling thereof becomes easier and production yield becomes higher. When the thickness is not more than 100 μm, it is better for obtaining good-quality fractured facets for the laser cavity.

In the group-III nitride semiconductor laser device according to the present invention, laser light from the active layer is polarized in a direction of the a-axis of the hexagonal group-III nitride semiconductor. In this group-III nitride semiconductor laser device, a band transition allowing for achievement of a low threshold current has polarized nature.

In the group-III nitride semiconductor laser device according to the present invention, light in the LED mode in the group-III nitride semiconductor laser device includes a polarization component I1 and a polarization component I2. The polarization component I1 is in the direction of the a-axis of the hexagonal group-III nitride semiconductor, and the polarization component I2 is in a direction indicated by projecting the c-axis of the hexagonal group-III nitride semiconductor onto the primary surface. The polarization component I1 is greater than the polarization component I2. This III-nitride semiconductor laser device can lase with the laser cavity to emit light in a mode having large emission intensity in the LED mode.

In the III-nitride semiconductor laser device according to the present invention, preferably, the semipolar primary surface is one of a {20-21} plane, a {10-11} plane, a {20-2-1} plane, and a {10-1-1} plane.

This group-III nitride semiconductor laser device allows for provision of first and second end faces with flatness and perpendicularity enough to construct the laser cavity of the group-III nitride semiconductor laser device, on these typical semipolar planes.

In the group-III nitride semiconductor laser device according to the present invention, a surface with a slight tilt in the range of not less than −4° and not more than +4° with respect to with respect to the semipolar plane of any one of a {20-21} plane, a {10-11} plane, a {20-2-1} plane, and a {10-1-1} plane, toward an m-plane can be used as the semipolar primary surface suitably.

This group-III nitride semiconductor laser device allows for provision of the first and second end faces with flatness and perpendicularity enough to construct the laser cavity of the group-III nitride semiconductor laser device on the surface slightly tilting from these typical semipolar planes.

In the group-III nitride semiconductor laser device according to the present invention, preferably, a stacking fault density of the support base is not more than $1\times10^4$ cm$^{-1}$.

In this group-III nitride semiconductor laser device, since the stacking fault density is not more than $1\times10^4$ cm$^{-1}$, the flatness and/or perpendicularity of the fractured facets is unlikely to be disturbed for a certain accidental reason.

In the group-III nitride semiconductor laser device according to the present invention, the support base can comprise any one of GaN, AlGaN, AlN, InGaN, and InAlGaN.

In this group-III nitride semiconductor laser device, when the substrate used comprises one of these GaN-based semiconductors, it becomes feasible to obtain the first and second end faces applicable to the cavity. Use of an AlN substrate or AlGaN substrate allows for increase in the degree of polarization and the enhancement of optical confinement by virtue of low refractive index. Use of an InGaN substrate allows for decrease in the degree of lattice mismatch between the substrate and the light emitting layer, and improvement in crystal quality.

The group-III nitride semiconductor laser device according to the present invention can further comprise a dielectric multilayer film provided on at least one of the first and second fractured faces.

In this group-III nitride semiconductor laser device, an end face coating is also applicable to the fractured faces. The end face coat allows for adjustment of reflectance.

In the group-III nitride semiconductor laser device according to the present invention, the active layer can include a quantum well structure provided so as to generate light at a wavelength of not less than 360 nm and not more than 600 nm. Since this group-III nitride semiconductor laser device makes use of the semipolar plane, the resultant group-III nitride semiconductor laser device makes efficient use of polarization in the LED mode, and achieves a low threshold current.

In the group-III nitride semiconductor laser device according to the present invention, more preferably, the active layer includes a quantum well structure provided so as to generate light at a wavelength of not less than 430 nm and not more than 550 nm. Since this group-III nitride semiconductor laser device makes use of the semipolar plane, it allows for increase in quantum efficiency through both decrease of the piezoelectric field and improvement in crystal quality of the light emitting layer region, and it is thus suitably applicable to generation of light at the wavelength of not less than 430 nm and not more than 550 nm.

In the group-III nitride semiconductor laser device according to the present invention, an end face of the support base and an end face of the semiconductor region are exposed in each of the first and second fractured faces, and an angle between the end face of the active layer in the semiconductor region and a reference plane perpendicular to the m-axis of the support base of the hexagonal nitride semiconductor is in the range of not less than (ALPHA-5)° and not more than (ALPHA+5)° in a first plane defined by the c-axis and the m-axis of the group-III nitride semiconductor.

This group-III nitride semiconductor laser device has the end faces that satisfy the foregoing perpendicularity, concerning the angle taken for one of the c-axis and the m-axis to the other.

In the group-III nitride semiconductor laser device according to the present invention, preferably, the angle is in the range of not less than −5° and not more than +5° in a second plane perpendicular to the first plane and the normal axis.

This group-III nitride semiconductor laser device has the end faces satisfying the foregoing perpendicularity, concerning the angle defined on the plane perpendicular to the normal axis to the semipolar surface.

In the group-III nitride semiconductor laser device according to the present invention, the electrode extends in a direction of a predetermined axis, and the first and second fractured faces intersect with the predetermined axis.

Another aspect of the present invention relates to a method of fabricating a group-III nitride semiconductor laser device. This method comprises the steps of: (a) preparing a substrate of a hexagonal group-III nitride semiconductor and having a semipolar primary surface; (b) forming a substrate product, the substrate product having a laser structure and the substrate, the laser structure including a semiconductor region, an anode electrode and a cathode electrode, the semiconductor region being formed on the semipolar primary surface; (c) scribing a first surface of the substrate product in part in a direction of the a-axis of the hexagonal group-III nitride semiconductor; and (d) carrying out breakup of the substrate product by press against a second surface of the substrate product, to form another substrate product and a laser bar. The first surface is opposite to the second surface. The semiconductor region is located between the first surface and the substrate. The laser bar extends from the first surface to the second surface, and has first and second end faces formed by the breakup. The first and second end faces constitute a laser cavity of the group-III nitride semiconductor laser device. The anode electrode and the cathode electrode are formed on the laser structure. The semiconductor region comprises a first cladding layer of a first conductivity type gallium nitride-based semiconductor, a second cladding layer of a second conductivity type gallium nitride-based semiconductor, and an active layer. The active layer is provided between the first cladding layer and the second cladding layer. The first cladding layer, the second cladding layer, and the active layer are arranged along a axis normal to the semipolar primary surface. The active layer comprises a gallium nitride-based semiconductor layer; the c-axis of the hexagonal group-III nitride semiconductor of the substrate tilts at an angle ALPHA with respect to the normal axis toward the m-axis of the hexagonal group-III nitride semiconductor. The first and second end faces intersect with an m-n plane defined by the normal axis and the m-axis of the hexagonal group-III nitride semiconductor.

According to this method, the first surface of the substrate product is scribed in the direction of the a-axis of the hexagonal group-III nitride semiconductor, and thereafter the breakup of the substrate product is carried out by press against the second surface of the substrate product, thereby forming the other substrate product and the laser bar. Then, the laser bar is provided with the first and second end faces that intersect the m-n plane defined by the normal axis and the m-axis of the hexagonal group-III nitride semiconductor. This method of forming end faces provides the first and second end faces with flatness and perpendicularity enough to construct the laser cavity of the group-III nitride semiconductor laser device, or the laser cavity mirror faces without ion damage.

In this method, the laser waveguide extends in the direction of tilt of the c-axis of the hexagonal group-III nitride, and the mirror end faces of the cavity with which this laser waveguide can be provided are formed without use of dry-etched facets.

In the method according to the present invention, forming the substrate product comprises performing processing such as slicing or grinding of the substrate such that a thickness of the substrate becomes not more than 400 μm. The second surface can be a processed surface made by the above processing. Alternatively, it can be a surface including an electrode formed on the processed surface.

In the method according to the present invention, forming the substrate product comprises polishing the substrate such that a thickness of the substrate becomes not less than 50 μm and not more than 100 μm. The second surface can be a polished surface formed by the polishing. Alternatively, it can be a surface including an electrode formed on the polished surface.

When the substrate has such thickness, it is feasible to form the first and second end faces with flatness and perpendicularity enough to construct the laser cavity of the group-III nitride semiconductor laser device, or without ion damage, and its production yield is excellent.

In the method according to the present invention, the angle ALPHA falls within the range of not less than 45° and not more than 80° and within the range of not less than 100° and not more than 135°. When the angle falls within the range of less than 45° and within the range of more than 135°, the end faces formed by press are highly likely to be composed of m-planes. The angle falling within the range of more than 80° and less than 100° does not achieve desired flatness and perpendicularity.

In the method according to the present invention, more preferably, the angle ALPHA falls within the range of not less than 63° and not more than 80° and within the range of not less than 100° and not more than 117°. When the angle is in the range of less than 63° and in the range of more than 117°, an m-plane is likely to appear in part of an end face made by press. The angle in the range of more than 80° and less than 100° does not achieve desired flatness and perpendicularity.

In the method according to the present invention, preferably, the semipolar primary surface is made of any one of a {20-21} plane, a {10-11} plane, a {20-2-1} plane, and a {10-1-1} plane.

These semipolar planes can provide the first and second end faces with flatness and perpendicularity enough to construct the laser cavity of the group-III nitride semiconductor laser device, or without ion damage.

In the method according to the present invention, a surface with a slight tilt in the range of not less than −4° and not more than +4° from the semipolar plane of any one of a {20-21} plane, a {10-11}plane, a {20-2-1} plane, and a {10-1-1} plane, toward the m-plane can be used as the semipolar primary surface suitably.

When the slight tilt surface tilts from these typical semipolar planes, it is also feasible to provide the first and second end faces with flatness and perpendicularity enough to construct the laser cavity of the group-III nitride semiconductor laser device, or without ion damage.

In the method according to the present invention, the scribing is performed using a laser scriber, the scribing forms a scribed groove, and a length of the scribed groove is shorter than a length of an intersecting line between an a-n plane defined by the normal axis and the a-axis of the hexagonal group-III nitride semiconductor, and the first surface.

According to this method, the other substrate product and the laser bar are formed by fracture of the substrate product. This fracture is brought about by using the scribed groove shorter than a fracture line of the laser bar.

In the method according to the present invention, an end face of the active layer in each of the first and second end faces can make an angle in the range of not less than (ALPHA−5)° and not more than (ALPHA+5)° in a plane defined by the c-axis and the m-axis of the hexagonal group-III nitride semiconductor, and the angle is defined with respect to a reference plane perpendicular to the m-axis of the support base of the hexagonal nitride semiconductor.

This method allows for forming the end faces with the above-mentioned perpendicularity for the angle taken from one of the c-axis and the m-axis to the other.

In the method according to the present invention, the substrate can comprise any one of GaN, AlN, AlGaN, InGaN and InAlGaN. This method allows the first and second end faces applicable to the cavity obtained through the use of the substrate made of one of these GaN-based semiconductors.

The above objects and the other objects, features, and advantages of the present invention can more readily become apparent in view of the following detailed description of the preferred embodiments of the present invention proceeding with reference to the accompanying drawings.

EFFECT OF THE INVENTION

As described above, the present invention provides the group-III nitride semiconductor laser device with a laser cavity enabling a low threshold current, on the semipolar surface of a support base that tilts with respect to the c-axis toward the m-axis of a hexagonal group-III nitride. The present invention also provides the method of fabricating the group-III nitride semiconductor laser device.

BRIEF DESCRIPTION OF THE DRAWINGS

FIG. 13 is a drawing showing angles between (20-21) plane and other plane orientations (indices).

MODES FOR CARRYING OUT THE INVENTION

The expertise of the present invention can be readily understood in view of the following detailed description with reference to the accompanying drawings provided by way of illustration only. The following will describe embodiments of the group-III nitride semiconductor laser device and the method of fabricating the group-III nitride semiconductor laser device according to the present invention, with reference to the accompanying drawings. The same portions will be denoted by the same reference symbols if possible.

Figure 1:
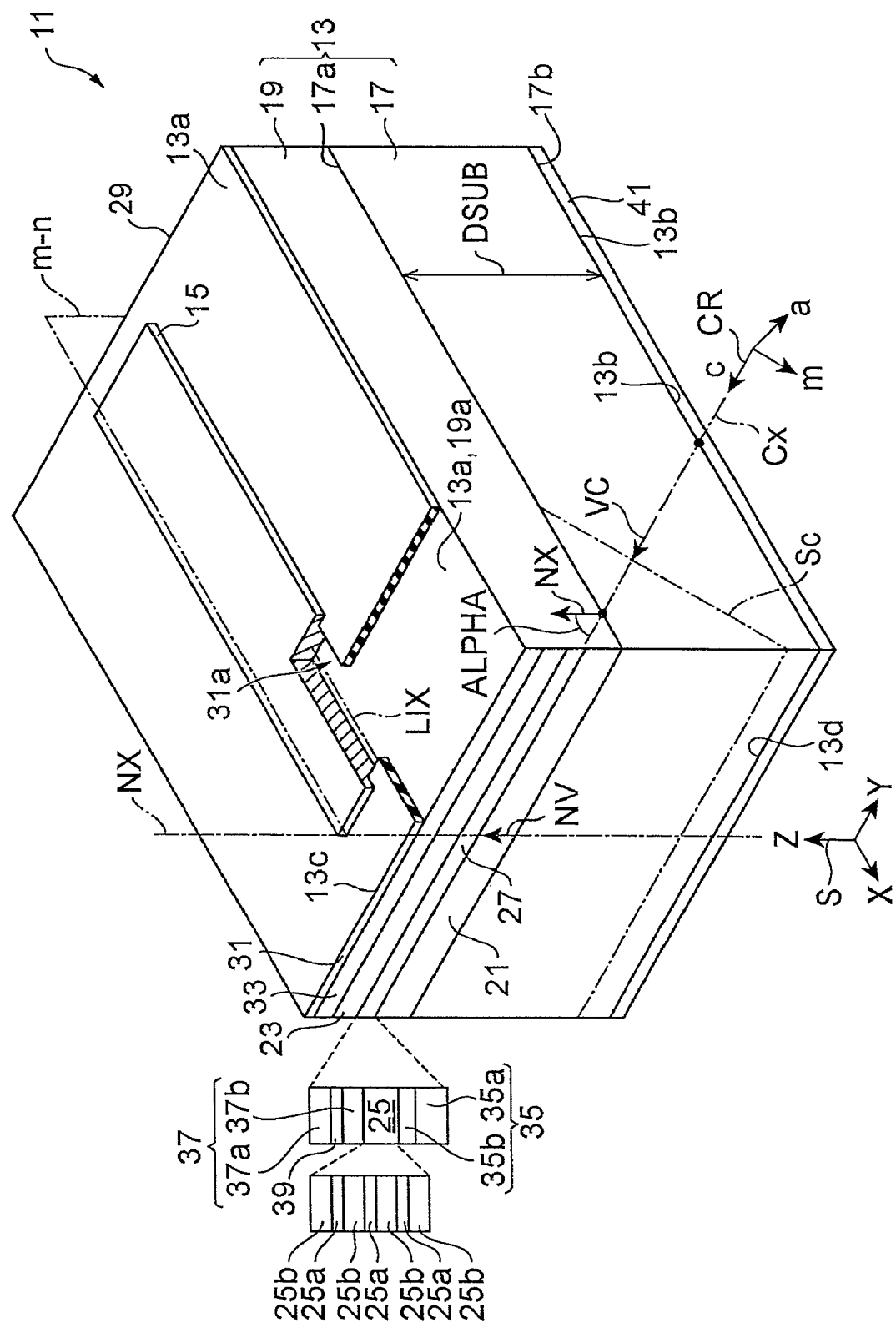
FIG. 1 is a drawing schematically showing a structure of a group-III nitride semiconductor laser device according to an embodiment of the present invention.

FIG. 1 is a drawing schematically showing a structure of a group-III nitride semiconductor laser device according to an embodiment of the present invention. The group-III nitride semiconductor laser device 11 has a gain-guiding type structure, but embodiments of the present invention are not limited to the gain-guiding type structure. The group-III nitride semiconductor laser device 11 has a laser structure 13 and an electrode 15. The laser structure 13 includes a support base 17 and a semiconductor region 19. The support base 17 comprises a hexagonal group-III nitride semiconductor and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23 and an active layer 25. The first cladding layer 21 comprises a first conductivity type gallium nitride based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes gallium nitride based semiconductor layers, and the gallium nitride based semiconductor layers are, for example, well layers 25a. The active layer 25 includes barrier layers 25b of a gallium nitride based semiconductor, and the well layers 25a and the barrier layers 25b are alternately arranged. The well layers 25a comprise, for example, of InGaN or the like and the barrier layers 25b, for example, GaN, InGaN, or the like. The active layer 25 can include a quantum well structure provided so as to generate light at the wavelength of not less than 360 nm and not more than 600 nm, and making use of the semipolar surface is suitably applicable to generation of light at the wavelength of not less than 430 nm and not more than 550 nm. The first cladding layer 21, the second cladding layer 23, and the active layer 25 are arranged along an axis NX normal to the semipolar primary surface 17a. In the group-III nitride semiconductor laser device 11, the laser structure 13 includes a first fractured face 27 and a second fractured face 29, which intersect with an m-n plane defined by the normal axis NX and the m-axis of the hexagonal group-III nitride semiconductor.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X-axis and the Y-axis of the orthogonal coordinate system S. In FIG. 1, a typical c-plane Sc is also depicted. The c-axis of the hexagonal group-III nitride semiconductor of the support base 17 tilts at an angle ALPHA with respect to the normal axis NX toward the m-axis of the hexagonal group-III nitride semiconductor.

The group-III nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 comprises a hexagonal group-III nitride semiconductor. The insulating film 31 has an opening 31a, and the opening 31a extends in a direction of an intersecting line LIX between the surface 19a of the semiconductor region 19 and the foregoing m-n plane, and has, for example, a stripe shape. The electrode 15 is in contact with the surface 19a of the semiconductor region 19 (e.g., a contact layer 33 of the second conductivity type) through the opening 31a, and extends in the direction of the foregoing intersecting line LIX. In the group-III nitride semiconductor laser device 11, a laser waveguide includes the first cladding layer 21, the second cladding layer 23 and the active layer 25, and extends in the direction of the foregoing intersecting line LIX.

In the group-III nitride semiconductor laser device 11, the first fractured face 27 and the second fractured face 29 intersect with the m-n plane defined by the m-axis of the hexagonal group-III nitride semiconductor and the normal axis NX. A laser cavity of the group-III nitride semiconductor laser device 11 includes the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The first and second fractured faces 27, 29 extend from an edge 13c of the first surface 13a to an edge 13d of the second surface 13b. The first and second fractured faces 27, 29 are different from the conventional cleaved facets like c-planes, m-planes, or a-planes.

In this group-III nitride semiconductor laser device 11, the first and second fractured faces 27, 29 that form the laser cavity intersect with the m-n plane. This allows for provision of the laser waveguide extending in the direction of the intersecting line between the m-n plane and the semipolar surface 17a. For this reason, the group-III nitride semiconductor laser device 11 has the laser cavity enabling a low threshold current.

The group-III nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, of GaN, InGaN, or the like. The p-side optical guide layer 37 includes a first portion 37a and a second portion 37b, and the p-side optical guide layer 37 comprises, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 2:
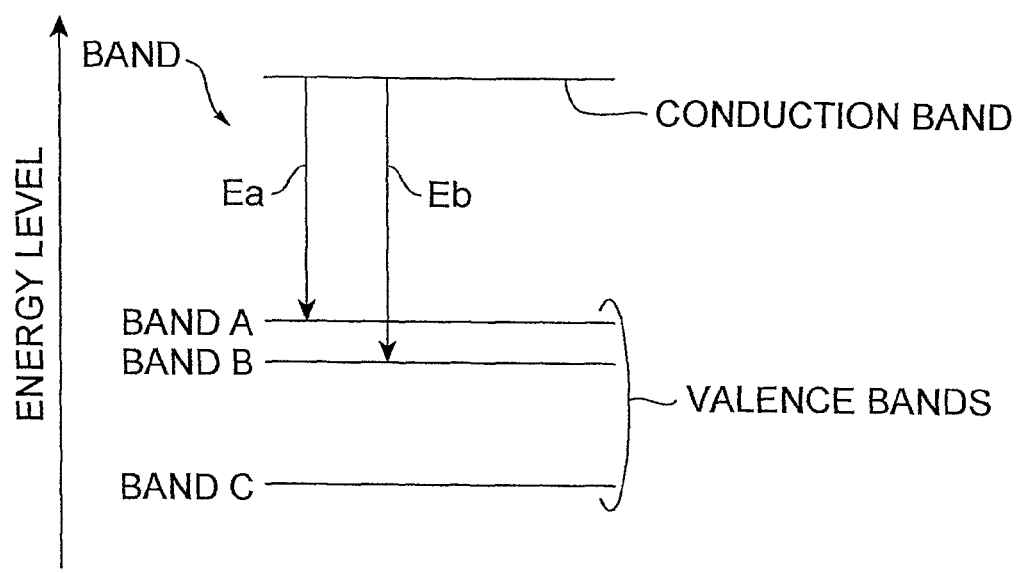
FIG. 2 is a drawing showing a band structure in an active layer in the group-III nitride semiconductor laser device.
Figure 2:
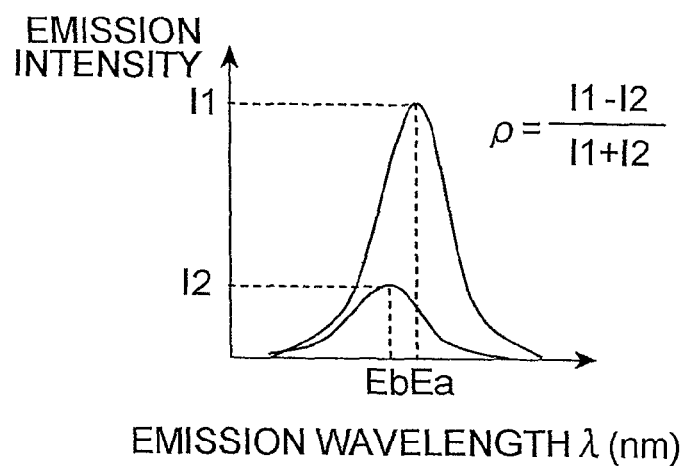
Figure 3:
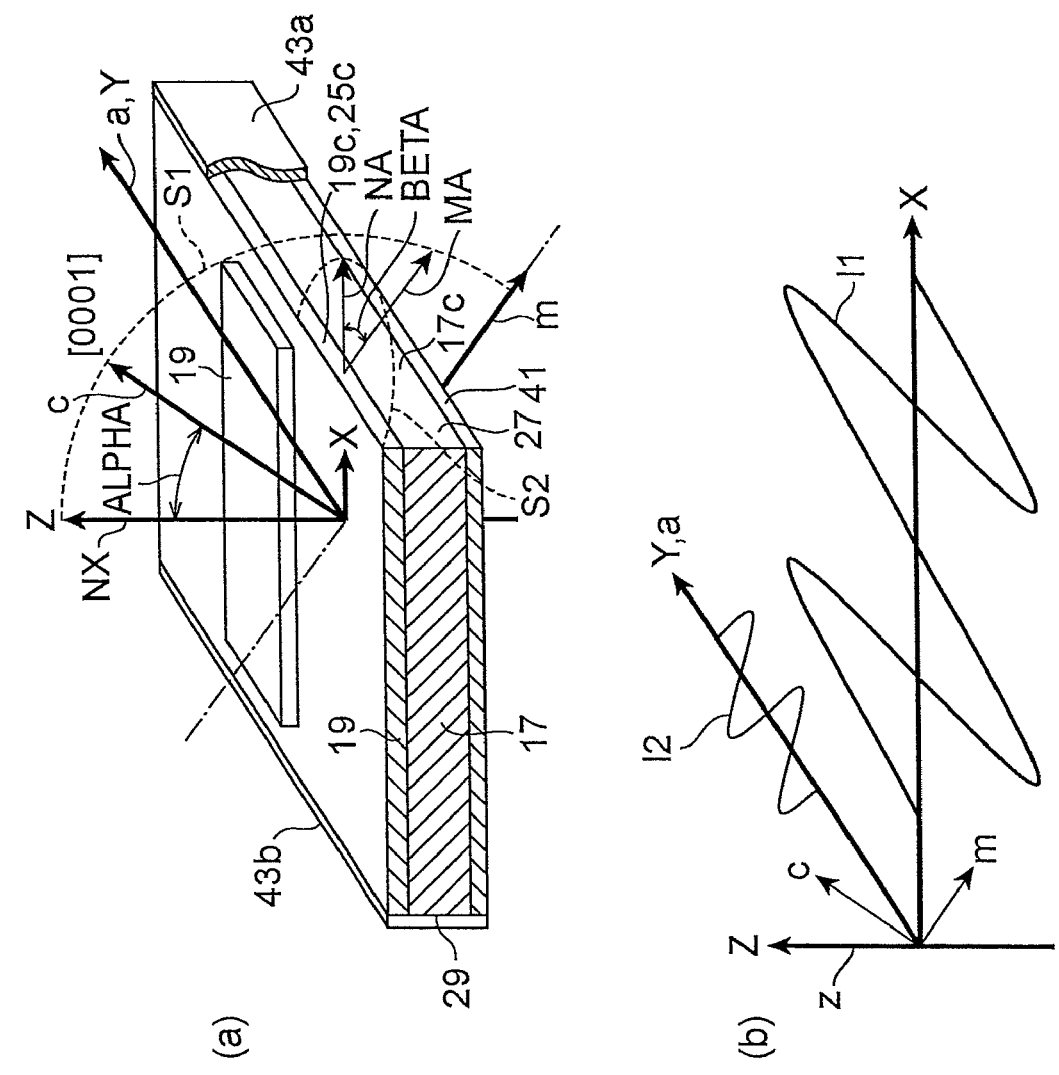
FIG. 3 is a drawing showing polarization of emission in the active layer of the group-III nitride semiconductor laser device.
Figure 4:
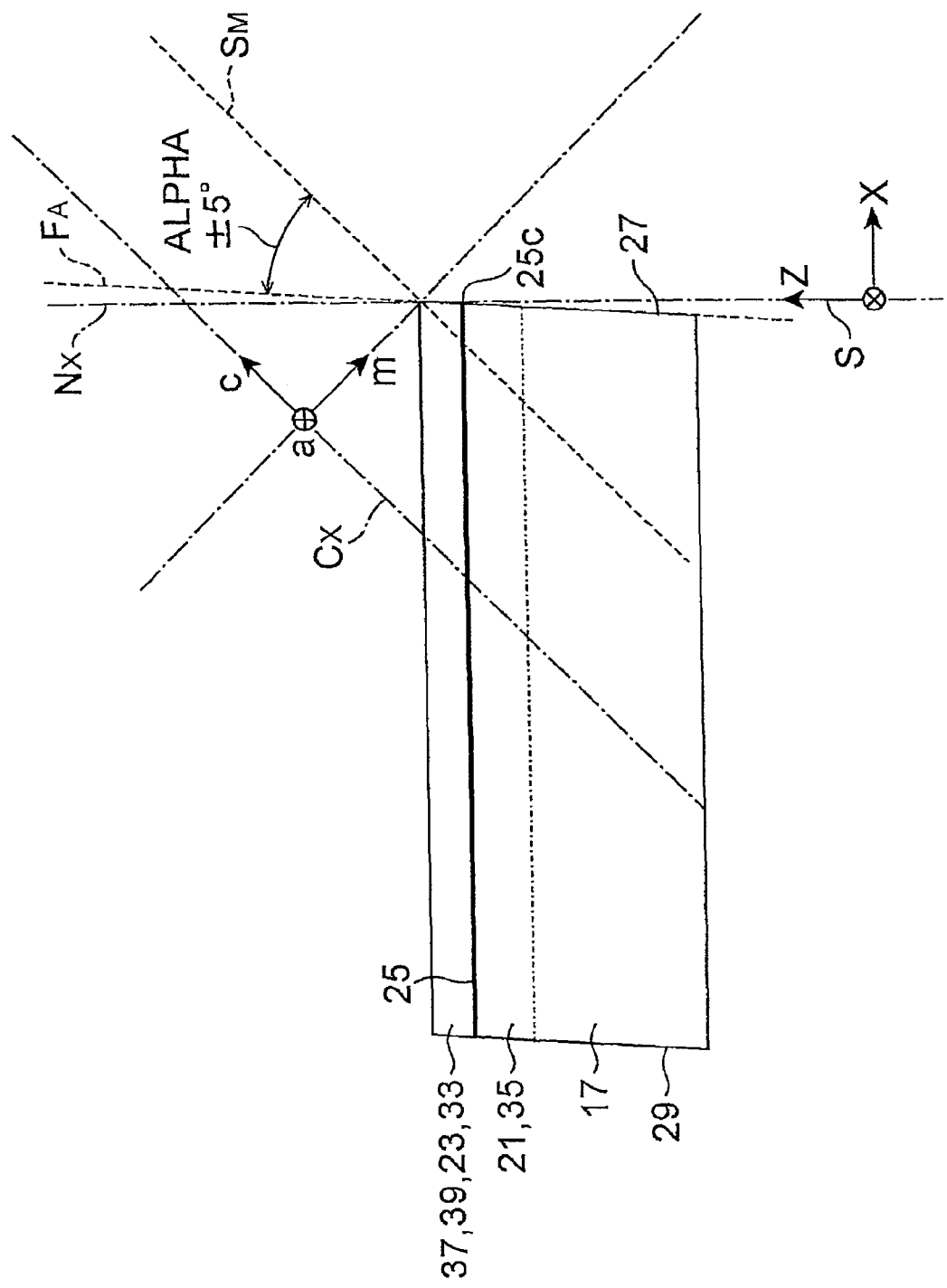
FIG. 4 is a drawing showing a relation between an end face of the group-III nitride semiconductor laser device and an m-plane of the active layer.

FIG. 2 is a drawing showing a band structure in the active layer in the group-III nitride semiconductor laser device. FIG. 3 is a drawing showing polarization of emission from the active layer 25 of the group-III nitride semiconductor laser device 11. FIG. 4 is a schematic cross sectional view taken along a plane defined by the c-axis and the m-axis. With reference to Part (a) of FIG. 2, three possible transitions between the conduction band and valence bands in the vicinity of Γ point of the band structure BAND are shown. The energy difference between band A and band B is relatively small. An emission by transition Ea between the conduction band and band A is polarized in the a-axis direction, and an emission by transition Eb between the conduction band and band B is polarized in a direction of the c-axis projected onto the primary surface. Concerning lasing, a threshold of transition Ea is smaller than a threshold of transition Eb.

With reference to Part (b) of FIG. 2, there are shown spectra of light in the LED mode in the group-III nitride semiconductor laser device 11. The light in the LED mode includes a polarization component I1 in the direction of the a-axis of the hexagonal group-III nitride semiconductor, and a polarization component I2 in the direction of the projected c-axis of the hexagonal group-III nitride semiconductor onto the primary surface, and the polarization component I1 is larger than the polarization component I2. Degree of polarization ρ is defined by (I1−I2)/(I1+I2). The laser cavity of the group-III nitride semiconductor laser device 11 enables the device to emit a laser beam in the mode that has large emission intensity in the LED mode.

As shown in FIG. 3, the device may be further provided with dielectric multilayer film 43a, 43b on at least one of the first and second fractured faces 27, 29 or on the respective faces. An end face coating is also applicable to the fractured faces 27, 29. The end face coating allows adjustment of their reflectance.

As shown in Part (b) of FIG. 3, the laser light L from the active layer 25 is polarized in the direction of the a-axis of the hexagonal group-III nitride semiconductor. In this group-III nitride semiconductor laser device 11, a band transition allowing for implementation of a low threshold current has polarized nature. The first and second fractured faces 27, 29 for the laser cavity are different from the conventional cleaved facets like c-planes, m-planes, or a-planes. But, the first and second fractured faces 27, 29 have flatness and perpendicularity as mirrors for lasing cavity. For this reason, by using the first and second fractured faces 27, 29 and the laser waveguide extending between these fractured faces 27, 29, as shown in Part (b) of FIG. 3, it becomes feasible to achieve low-threshold lasing through the use of the emission by transition Ea stronger than the emission by transition Eb that is polarized in the direction indicated by the c-axis projected onto the primary surface.

In the group-III nitride semiconductor laser device 11, an end face 17c of the support base 17 and an end face 19c of the semiconductor region 19 are exposed in each of the first and second fractured faces 27 and 29, and the end face 17c and the end face 19c are covered with the dielectric multilayer film 43a. An angle BETA between an m-axis vector MA of the active layer 25 and a vector NA normal to the end face 17c of the support base 17, and an end face 25c in the active layer 25 has a component $(BETA)_1$ defined on a first plane S1, which is defined by the c-axis and m-axis of the group-III nitride semiconductor, and a component $(BETA)_2$ defined on a second plane S2 (referred to as "S2" for easier understanding), which is perpendicular to the first plane S1 (referred to as "S1" for easier understanding) and the normal axis NX. The component $(BETA)_1$ is preferably in the range of not less than (ALPHA−5)° and not more than (ALPHA+5)° in the first plane S1 defined by the c-axis and m-axis of the group-III nitride semiconductor. This angular range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This group-III nitride semiconductor laser device 11 has the end faces in which the angle BETA taken from one of the c-axis and the m-axis to the other satisfies the aforementioned perpendicularity. The component (BETA)$_2$ is preferably in the range of not less than $-5°$ and not more than $+5°$ on the second plane S2. Here, $BETA^2 = (BETA)_1^2 + (BETA)_2^2$. The end faces 27 and 29 of the group-III nitride semiconductor laser device 11 satisfy the aforementioned perpendicularity as to the in-plane angle defined in the plane that is perpendicular to the normal axis NX to the semipolar surface 17a.

Referring again to FIG. 1, in the group-III nitride semiconductor laser device 11, the thickness DSUB of the support base 17 is preferably not more than 400 μm. This group-III nitride semiconductor laser device can provide good-quality fractured faces for the laser cavity. In the group-III nitride semiconductor laser device 11, the thickness DSUB of the support base 17 is more preferably not less than 50 μm and not more than 100 μm. This group-III nitride semiconductor laser device 11 can be provided good-quality fractured faces more preferred for the laser cavity. Furthermore, its handling becomes easier and the production yield can be improved.

In the group-III nitride semiconductor laser device 11, the angle ALPHA between the normal axis NX and the c-axis of the hexagonal group-III nitride semiconductor is preferably not less than 45° and preferably not more than 80°, and the angle ALPHA is preferably not less than 100° and preferably not more than 135°. When the angle is in the range of less than 45° and in the range of more than 135°, the end faces made by press are highly likely to be comprised of m-planes. When the angle is in the range of more than 80° and less than 100°, it could result in failing to achieve desired flatness and perpendicularity.

In the group-III nitride semiconductor laser device 11, more preferably, the angle ALPHA between the normal axis NX and the c-axis of the hexagonal group-III nitride semiconductor is not less than 63° and not more than 80°. Furthermore, the angle ALPHA is particularly preferably not less than 100° and not more than 117°. When the angle is in the range of less than 63° and in the range of more than 117°, an m-plane can be formed in part of an end face made by press. When the angle is in the range of more than 80° and less than 100°, it could result in failing to achieve desired flatness and perpendicularity.

The semipolar primary surface 17a can be any one of a {20-21} plane, a {10-11} plane, a {20-2-1} plane and a {10-1-1} plane. Furthermore, a surface with a slight tilt in the range of not less than $-4°$ and not more than $+4°$ with respect to these planes may also be applied as the primary surface. On the semipolar surface 17a of one of these typical planes, it is feasible to provide the first and second end faces 27 and 29 with flatness and perpendicularity enough to construct the laser cavity of the group-III nitride semiconductor laser device 11. Furthermore, end faces with sufficient flatness and perpendicularity are obtained in an angular range across these typical plane orientations.

In the group-III nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The support base 17 can comprise any one of GaN, AlN, AlGaN, InGaN, and InAlGaN. When the substrate of any one of these GaN-based semiconductors is used, the end faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease degree of the lattice mismatch between the substrate and the light emitting layer and to improve crystal quality.

Figure 5:
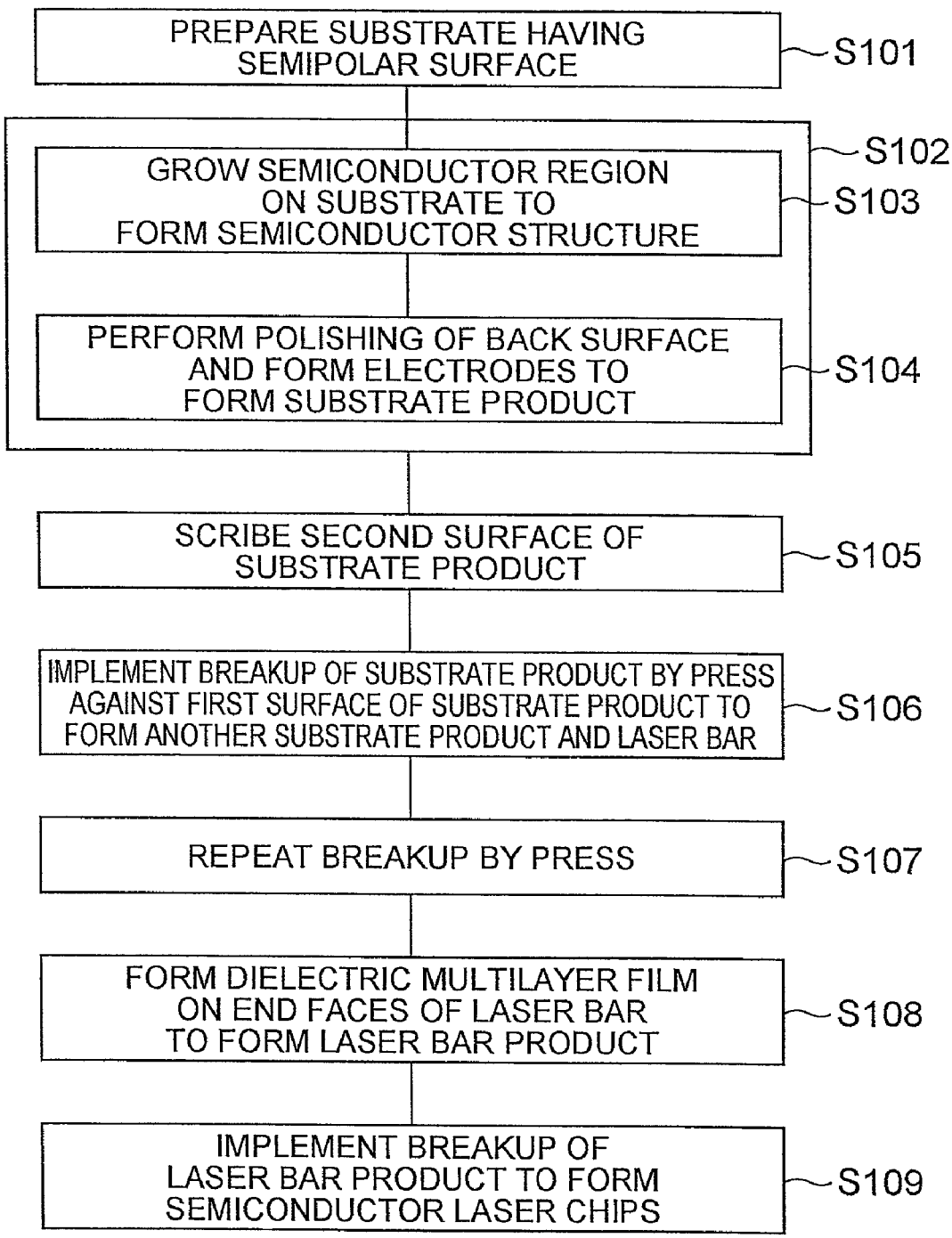
FIG. 5 is a flowchart showing major steps in a method of fabricating the group-III nitride semiconductor laser device according to the embodiment.

FIG. 5 is a drawing showing major steps in a method of fabricating the group-III nitride semiconductor laser device according to the present embodiment. With reference to Part (a) of FIG. 6, a substrate 51 is shown. In step S101, the substrate 51 is prepared for fabrication of the group-III nitride semiconductor laser device. The c-axis (vector VC) of the hexagonal group-III nitride semiconductor of the substrate 51 tilts at an angle ALPHA with respect to the normal axis NX toward the m-axis (vector VM) of the hexagonal group-III nitride semiconductor. Accordingly, the substrate 51 has a semipolar primary surface 51a of the hexagonal group-III nitride semiconductor.

In step S102, a substrate product SP is formed. In Part (a) of FIG. 6, the substrate product SP is depicted as a member of a nearly disklike shape, but the shape of the substrate product SP is not limited thereto. For obtaining the substrate product SP, step S103 is first performed to form a laser structure 55. The laser structure 55 includes a semiconductor region 53 and the substrate 51, and in step S103, the semiconductor region 53 is grown on the semipolar primary surface 51a. For forming the semiconductor region 53, a first conductivity type GaN-based semiconductor region 57, a light emitting layer 59, and a second conductivity type GaN-based semiconductor region 61 are grown sequentially on the semipolar primary surface 51a. The GaN-based semiconductor region 57 can include, for example, an n-type cladding layer and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The GaN-based semiconductor region 57, the light emitting layer 59, and the second conductivity type GaN-based semiconductor region 61 are arranged in the direction of the normal axis NX to the semipolar primary surface 51a. These semiconductor layers are epitaxially grown thereon. The surface of the semiconductor region 53 is covered with an insulating film 54. The insulating film 54 comprises, for example, of silicon oxide. The insulating film 54 has an opening 54a. The opening 54a has, for example, a stripe shape.

Step S104 is carried out to form an anode electrode 58a and a cathode electrode 58b on the laser structure 55. Before forming the electrode on the back surface of the substrate 51, the back surface of the substrate used in crystal growth is polished to form a substrate product SP in desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. After these steps, the substrate product SP is obtained. The substrate product SP includes a first surface 63a, and a second surface 63b located opposite thereto. The semiconductor region 53 is located between the first surface 63a and the substrate 51.

Figure 6:
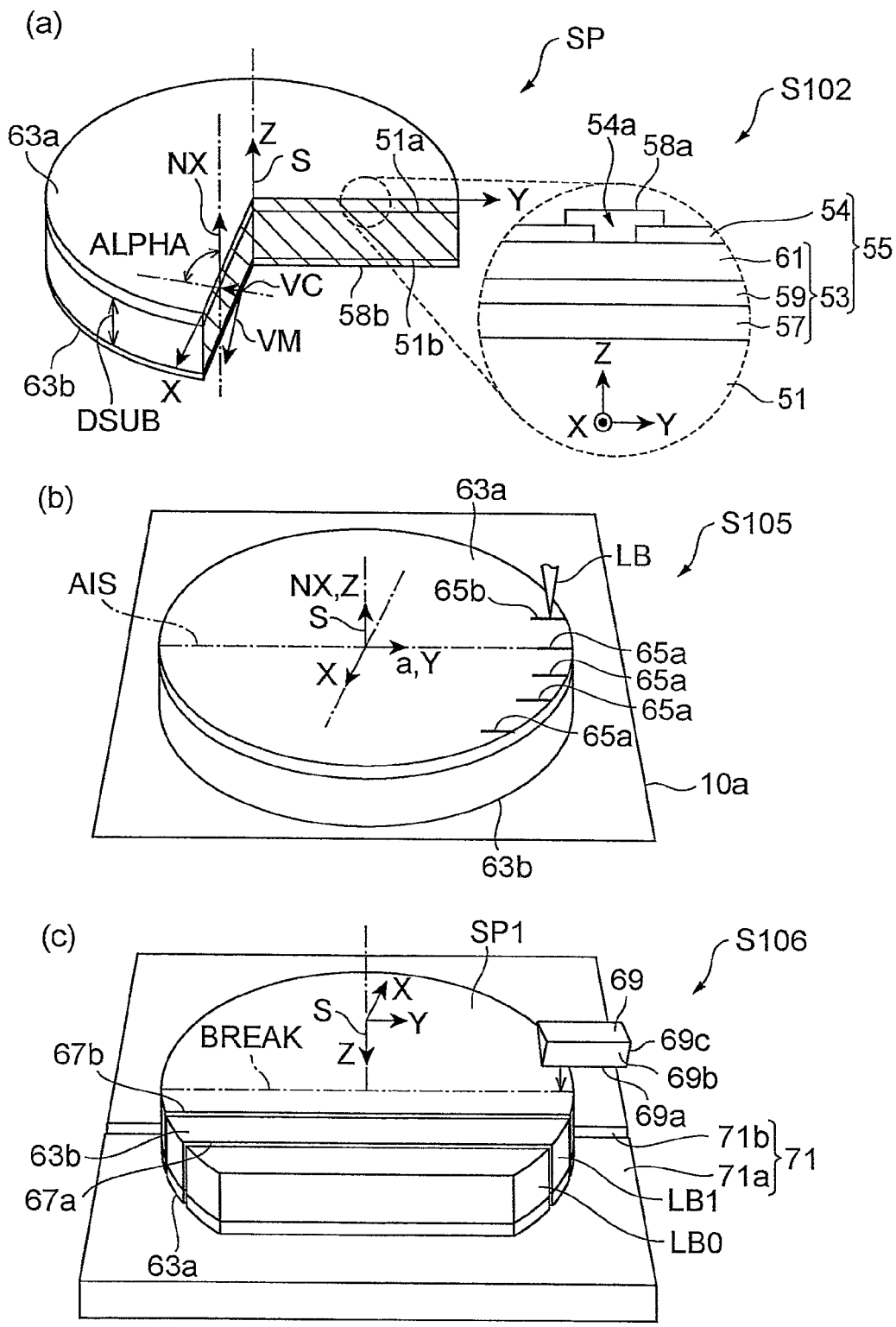
FIG. 6 is a drawing schematically showing major steps in the method of fabricating the group-III nitride semiconductor laser device according to the embodiment.

Step S105 is carried out, as shown in Part (b) of FIG. 6, to scribe the first surface 63a of the substrate product SP. This scribing step is carried out with a laser scriber 10a. This scribing step forms scribed grooves 65a. In Part (b) of FIG. 6, five scribed grooves are already formed, and formation of a scribed groove 65b is in progress with laser beam LB. The length of the scribed grooves 65a is shorter than the length of an intersecting line AIS between the first surface 63a and an a-n plane defined by the normal axis NX and the a-axis of the hexagonal group-III nitride semiconductor, and the laser beam LB is applied to a part of the intersecting line AIS. By the application with the laser beam LB, grooves extending in the specific direction and reaching the semiconductor region are formed in the first surface 63a. The scribed grooves 65a can be formed, for example, in an edge of the substrate product SP.

As shown in Part (c) of FIG. 6, step S106 is carried out to implement breakup of the substrate product SP by press against the second surface 63b of the substrate product SP, thereby forming a substrate product SP1 and a laser bar LB1. The press is carried out with a breaking device, such as, a blade 69. The blade 69 includes an edge 69a extending in one direction, and at least two blade faces 69b and 69c that are formed to define the edge 69a. The pressing onto the substrate product SP1 is carried out on a support device 71. The support device 71 includes a support table 71a and a recess 71b, and the recess 71b extends in one direction. The recess 71b is formed in the support table 71a. The orientation and position of the scribed groove 65a of the substrate product SP1 are aligned with the extending direction of the recess 71b of the support device 71 to position the substrate product SP1 to the recess 71b on the support device 71. The orientation of the edge of the breaking device is aligned with the extending direction of the recess 71b, and the edge of the breaking device is pressed against the substrate product SP1 from a direction intersecting with the second surface 63b. The intersecting direction is preferably an approximately vertical direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to mirrors for the laser cavity of the semiconductor laser.

The laser bar LB1 thus formed has the first and second end faces 67a, 67b formed by the aforementioned breakup, and each of the end faces 67a, 67b extends from the first surface 63a to the second surface 63b. The end faces 67a, 67b form the laser cavity of the group-III nitride semiconductor laser device, and intersect with the XZ plane. This XZ plane corresponds to the m-n plane defined by the normal axis NX and the m-axis of the hexagonal group-III nitride semiconductor.

By use of this method, the first surface 63a of the substrate product SP is scribed in the direction of the a-axis of the hexagonal group-III nitride semiconductor, and thereafter the breakup of the substrate product SP is carried out by press against the second surface 63b of the substrate product SP, thereby forming the new substrate product SP1 and the laser bar LB1. This method allows the formation of the first and second end faces 67a, 67b, which intersect with the m-n plane, in the laser bar LB1. This end face forming method provides the first and second end faces 67a, 67b with flatness and perpendicularity enough to construct the laser cavity of the group-III nitride semiconductor laser device.

In this method, the laser waveguide thus formed extends in the direction of inclination of the c-axis of the hexagonal group-III nitride. The end faces of the laser cavity mirror allowing for provision of this laser waveguide are formed without use of dry-etching.

This method involves the fracturing of the substrate product SP1, thereby forming the new substrate product SP1 and the laser bar LB1. In Step S107, the breakup is repeatedly carried out by press to produce a number of laser bars. This fracture propagates along the scribed grooves 65a shorter than a fracture line BREAK of the laser bar LB1.

In Step S108, dielectric multilayer films is formed on the end faces 67a, 67b of the laser bar LB1 to form a laser bar product. In Step S109, this laser bar product is separated into individual semiconductor laser dies.

In the fabrication method according to the present embodiment, the angle ALPHA can be in the range of not less than 45° and not more than 80° and in the range of not less than 100° and not more than 135°. When the angle is in the range of less than 45° and in the range of more than 135°, the end face made by press becomes highly likely to be comprised of an m-plane. When the angle is in the range of more than 80° and less than 100°, it may result in failing to achieve desired flatness and perpendicularity. More preferably, the angle ALPHA can be in the range of not less than 63° and not more than 80° and in the range of not less than 100° and not more than 117°. When the angle is in the range of less than 45° and in the range of more than 135°, an m-plane can be formed in part of an end face formed by press. When the angle is in the range of more than 80° and less than 100°, it may result in failing to achieve desired flatness and perpendicularity. The semipolar primary surface 51a can be any one of a {20-21} plane, a {10-11} plane, a {20-2-1} plane, and a {10-1-1} plane. Furthermore, a surface slightly tilted in the range of not less than −4° and not more than +4° from the above planes is also used as the primary surface. On these typical semipolar planes, it is feasible to provide the end faces for the laser cavity with flatness and perpendicularity enough to construct the laser cavity of the group-III nitride semiconductor laser device.

The substrate 51 can be made of any one of GaN, AlN, AlGaN, InGaN, and InAlGaN. When any one of these GaN-based semiconductors is used for the substrate, it is feasible to obtain the end faces applicable to the laser cavity. The substrate 51 is preferably made of GaN.

In the step S104 of forming the substrate product SP, the semiconductor substrate used in crystal growth can be one subjected to processing such as slicing or grinding so that the substrate thickness becomes not more than 400 µm, whereby the second surface 63b of the semiconductor substrate becomes a processed surface formed by polishing. In this substrate thickness, the end faces 67a, 67b can be formed in good yield, and are provided with flatness and perpendicularity enough to construct the laser cavity of the group-III nitride semiconductor laser device or without ion damage. More preferably, the second surface 63b can be is a polished surface formed by polishing, and the thickness of the polished substrate is not more than 100 µm. For facilitating to handle the substrate product SP, the substrate thickness is preferably not less than 50 µm.

In the production method of the laser end faces according to the present embodiment, the angle BETA explained with reference to FIG. 3 can be also defined in the laser bar LB1. In the laser bar LB1, the component $(BETA)_1$ of the angle BETA is preferably in the range of not less than (ALPHA−5)° and not more than (ALPHA+5)° on a first plane (plane corresponding to the first plane S1 in the description with reference to FIG. 3) defined by the c-axis and m-axis of the group-III nitride semiconductor. The end faces 67a, 67b of the laser bar LB1 satisfy the aforementioned perpendicularity as to the angle component of the angle BETA taken from one of the c-axis and the m-axis to the other. The component $(BETA)_2$ of the angle BETA is preferably in the range of not less than −5° and not more than +5° on a second plane (plane corresponding to the second plane S2 shown in FIG. 3). These end faces 67a, 67b of the laser bar LB1 also satisfy the aforementioned perpendicularity as to the angle component of the angle BETA defined on the plane perpendicular to the normal axis NX to the semipolar surface 51a.

The end faces 67a, 67b are formed by break by press against the plurality of GaN-based semiconductor layers epitaxially grown on the semipolar surface 51a. Since they are epitaxial films on the semipolar surface 51a, each of the end faces 67a, 67b are not cleaved facets each having a low plane index like c-planes, m-planes, or a-planes which have been used heretofore for the conventional laser cavity mirrors. However, through the break of the stack of epitaxial films on the semipolar surface Ma, the end faces 67a, 67b have flatness and perpendicularity applicable as laser cavity mirrors.

Example 1

A GaN substrate with a semipolar surface is prepared, and perpendicularity of a fractured facet is observed as described below. The above substrate used has a {20-21}-plane GaN substrate formed by cutting a (0001) GaN ingot, thickly grown by HYPE, at the angle of 75° to the m-axis. The primary surface of the GaN substrate is mirror-finished, and the back surface has pear-skin which is finished by grinding. The thickness of the substrate is 370 μm.

On the back side in the pear-skin finish, a marking line is drawn, with a diamond pen, perpendicularly to the direction of the c-axis projected on the primary surface of the substrate, and thereafter the substrate is fractured by press. For observing the perpendicularity of the resultant fractured face, the substrate is observed from the a-plane direction with a scanning electron microscope.

Figure 7:
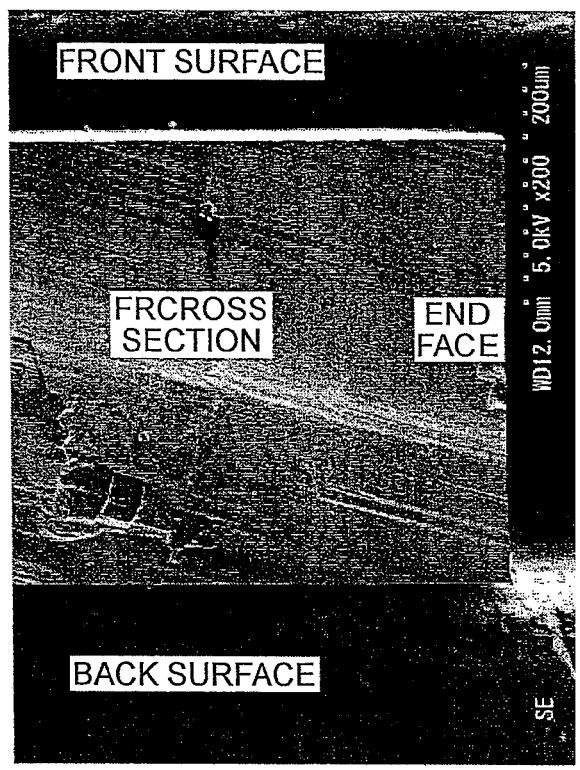
FIG. 7 is a drawing showing a scanning electron microscope image of a cavity end face, along with a {20-21} plane in crystal lattices.
Figure 7:
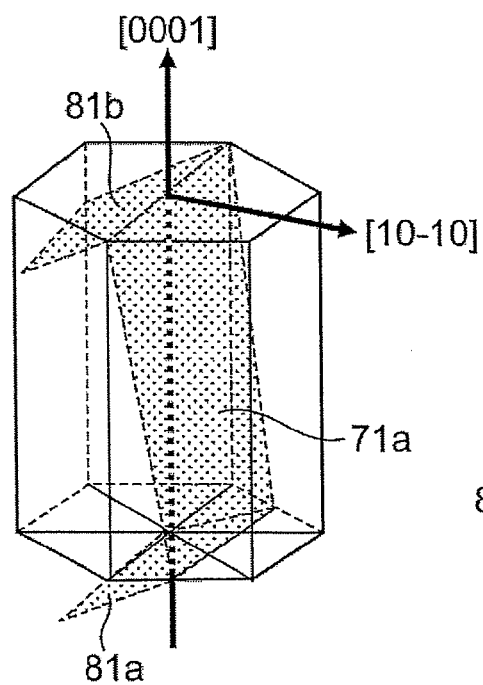
Figure 7:
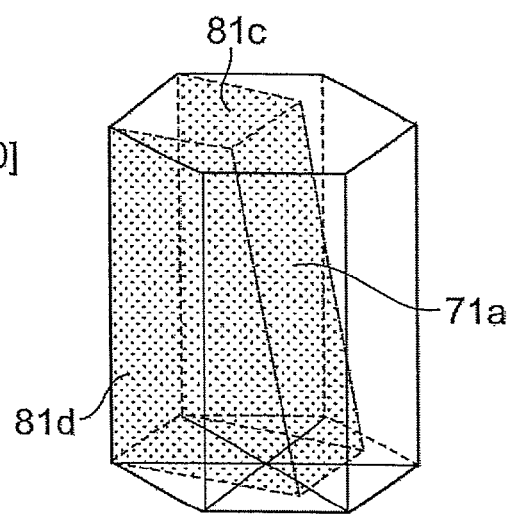

Part (a) of FIG. 7 shows a scanning electron microscope image of the fractured face observed from the a-plane direction, and the fractured face is shown as the right end face. As seen from the image, the fractured face has flatness and perpendicularity to the semipolar primary surface.

Example 2

Figure 8:
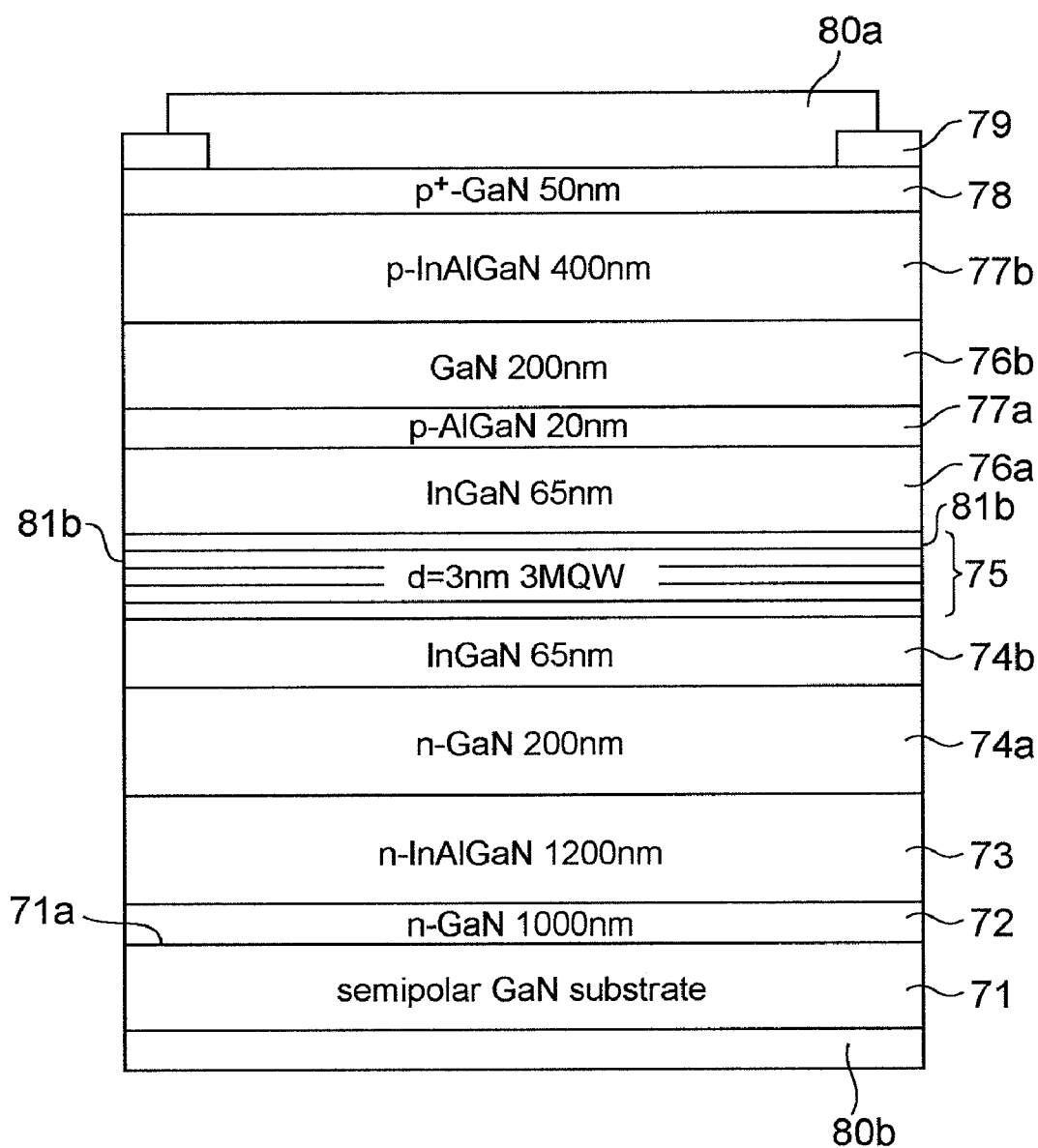
FIG. 8 is a drawing showing a structure of a laser diode shown in Example 1.

It is found in Example 1 that in the GaN substrate having the semipolar {20-21} plane, the fractured face is obtained by pressing the substrate after drawing the marking line perpendicular to the projected direction of the c-axis onto the primary surface of the substrate, and has the flatness and perpendicularity to the primary surface of the substrate. For estimating applicability of this fractured face to the laser cavity, a laser diode shown in FIG. 8 is grown by organometallic vapor phase epitaxy as described below. The raw materials used are as follows: trimethyl gallium (TMGa); trimethyl aluminum (TMA1); trimethyl indium (TMIn); ammonia ($NH_3$), and silane ($SiH_4$). A substrate 71 is prepared. A GaN substrate is prepared as the substrate 71, and the GaN substrate is cut with a wafer slicing apparatus at an angle in the range of 0° to 90° to the m-axis from a (0001) GaN ingot thickly grown by HYPE, in such a manner that the angle ALPHA of the c-axis tilted toward the m-axis has a desired off angle in the range of 0° to 90°. For example, when the substrate is formed by cutting at the angle of 75°, the resultant substrate is prepared as a GaN substrate having a {20-21}-plane and it is represented by reference symbol 71a in the hexagonal crystal lattice shown in Part (b) of FIG. 7.

Before the growth, the substrate is observed by the cathodoluminescence method in order to estimate the stacking fault density of the substrate. In the cathodoluminescence, an emission process of carriers excited by an electron beam is observed and in a stacking fault, non-radiative recombination of carriers occurs in the vicinity thereof, so that the stacking fault is expected be observed as a dark line. The stacking fault density is defined as a density (line density) per unit length of dark lines observed. The cathodoluminescence method of nondestructive measurement is applied herein in order to estimate the stacking fault density, but it is also possible to use destructive measurement, such as a transmission electron microscope. When a cross section of a sample is observed from the a-axis direction with the transmission electron microscope, a defect extending in the m-axis direction from the substrate toward the sample surface indicates a stacking fault contained in the support base, and the line density of stacking faults can be determined in the same manner as in the cathodoluminescence method.

The above substrate 71 is placed on a susceptor in a reactor, and the epitaxial layers are grown in the following growth procedure. First, an n-type GaN 72 is grown thereon and its the thickness is 1000 nm. Next, an n-type InAlGaN cladding layer 73 is grown thereon and its thickness is 1200 nm. Thereafter, an n-type GaN guide layer 74a and an undoped InGaN guide layer 74b are grown, their thickness are 200 nm and 65 nm, respectively, and then a three-cycle MQW 75 constituted by GaN 15 nm thick/InGaN 3 nm thick is grown thereon. Subsequently grown thereon are an undoped InGaN guide layer 76a of the thickness of 65 nm, a p-type AlGaN block layer 77a of the thickness of 20 nm, and a p-type GaN guide layer 76b of the thickness of 200 nm. Then, a p-type InAlGaN cladding layer 77b is grown thereon, and its thickness is 400 nm. Finally, a p-type GaN contact layer 78 is grown thereon and its thickness is 50 nm.

An insulating film 79 of $SiO_2$ is deposited on the contact layer 78 and then photolithography and wet etching processes are applied to form a stripe window having the width of 10 μm in the insulating film 79. In this step, two types of contact windows are formed in two stripe directions, respectively. These laser stripes are formed in the following directions: (1) M-direction (direction of the contact window extending along the predetermined plane defined by the c-axis and the m-axis); and (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using diamond slurry to produce a substrate product with the mirror-polished back surface. Then, the thickness of the thus formed substrate product is measured with a contact film thickness meter. The measurement of substrate thickness may also be carried out with a microscope from the observation of a cross section of a prepared sample. The microscope applicable herein can be an optical microscope or a scanning electron microscope. An n-side electrode 80b of Ti/Al/Ti/Au is formed by vapor deposition on the back surface (polished surface) of the GaN substrate (GaN wafer).

The laser cavity mirrors for these two types of laser stripes are produced with a laser scriber that uses the YAG laser at the wavelength of 355 nm. When the break is implemented with the laser scriber, the yield defined by lasing oscillation can be improved as compared with break implemented using a diamond scriber. The conditions for formation of the scribed grooves are as follows: laser beam output power of 100 mW; scanning speed of 5 mm/s. The scribed grooves thus formed each has, for example, the length of 30 μm, the width of 10 μm, and the depth of 40 μm. The scribed grooves are formed by applying the laser beam through the aperture of the insulating film of the substrate directly to the epitaxially grown surface at the pitch of 800 μm. The cavity length is 600 μm.

The laser cavity mirrors are made through fracture by use of a blade. A laser bar is produced by break by press against the back side of the substrate. More specifically, Parts (b) and (c) of FIG. 7 show relations between crystal orientations and fractured faces, for the {20-21}-plane GaN substrate. Part (b) of FIG. 7 shows the laser stripe that is provided to extend (1) in the M-direction, and shows end faces 81a, 81b for the laser cavity along with the semipolar surface 71a. The end faces 81a, 81b are approximately perpendicular to the semipolar surface 71a, but are different from the conventional cleaved facets like the hitherto used c-planes, m-planes, or a-planes. Part (c) of FIG. 7 shows the laser stripe that is provided to extend (2) in the <11-20> direction, and shows end faces 81c, 81d for the laser cavity along with the semipolar surface 71a. The end faces 81c, 81d are approximately perpendicular to the semipolar surface 71a and are composed of a-planes.

The fractured faces made by break are observed with a scanning electron microscope, and no prominent unevenness is observed in each of (1) and (2). From this result, the flatness (magnitude of unevenness) of the fractured faces can be not more than 20 nm. Furthermore, the perpendicularity of the fractured faces to the surface of the sample can be within the range of ±5°.

The end faces of the laser bar are coated with a dielectric multilayer film by vacuum vapor deposition. The dielectric multilayer film is composed of an alternate stack of $SiO_2$ and $TiO_2$. Each thickness thereof is adjusted in the range of 50 to 100 nm and is designed so that the center wavelength of reflectance falls within the range of 500 to 530 nm. The reflecting surface on one side has an alternate stack of ten cycles and a designed value of reflectance of about 95%, and the reflecting surface on the other side has an alternate stack of six cycles and a designed value of reflectance of about 80%.

The devices thus formed are energized to make their evaluation at room temperature. A pulsed power source is used as a power supply for the energization, and supplies pulses with the pulse width of 500 ns and the duty ratio of 0.1%, and the energization is implemented through probing needles that are in contact with the surface electrodes. In light output measurement, an emission from the end face of the laser bar is detected with a photodiode to obtain a current-light output characteristic (I-L characteristic). In measurement of emission wavelength, the emission from the end face of the laser bar is supplied through an optical fiber to a spectrum analyzer of a detector to measure a spectrum thereof. In estimation of a polarization, the emission from the laser bar is made to pass through a polarizing plate by rotation, thereby determining the polarization state. In observation of LED-mode emission, an optical fiber is aligned to the front surface side of the laser bar to measure optical emission from the front surface.

The polarization in the laser beam is measured for every laser device, and it is found that the laser beam is polarized in the a-axis direction. The oscillation wavelength is in a range of 500-530 nm.

Figure 9:
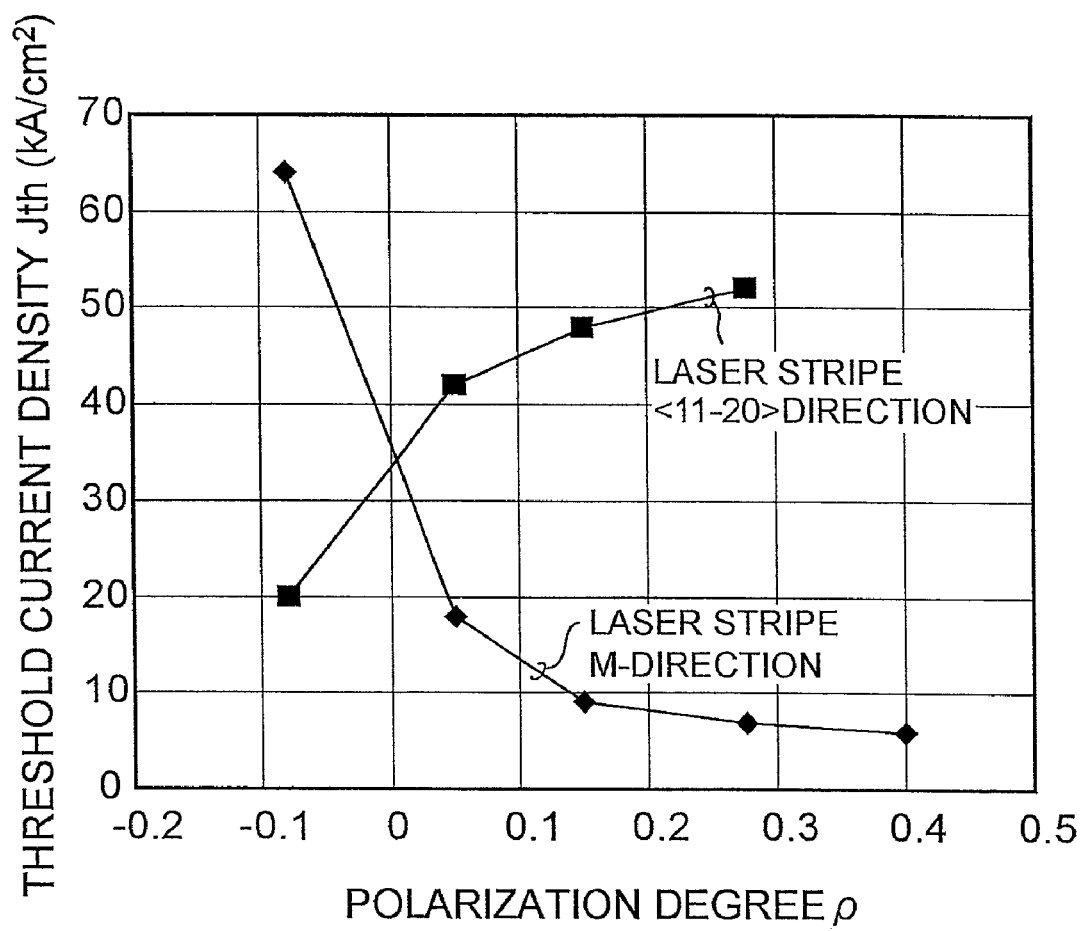
FIG. 9 is a drawing showing a relation of determined polarization degree ρ versus threshold current density.

The polarization state in the LED mode (i.e., spontaneous emission) is measured for every laser device. When the polarization component in the a-axis direction is referred to as I1, and the polarization component in the direction of the projected m-axis onto the primary surface is referred to as I2, the polarization degree ρ is defined as (I1−I2)/(I1+I2). The relation between determined polarization degree ρ and minimum of threshold current density is investigated, and the result obtained is shown in FIG. 9. As seen from FIG. 9, the threshold current density demonstrates a significant decrease in the laser (1) with the laser stripe along the M-direction when the polarization degree is positive. Namely, it is seen that when the polarization degree is positive (I1>I2) and the waveguide is provided along an off direction, the threshold current density is significantly decreased. The data shown in FIG. 9 is as follows.

| Polarization degree, | Threshold current, (M-direction stripe), | Threshold current, (<11-20> stripe), |
|---|---|---|
| 0.08, | 64, | 20; |
| 0.05, | 18, | 42; |
| 0.15, | 9, | 48; |
| 0.276, | 7, | 52; |
| 0.4, | 6. | |

Figure 10:
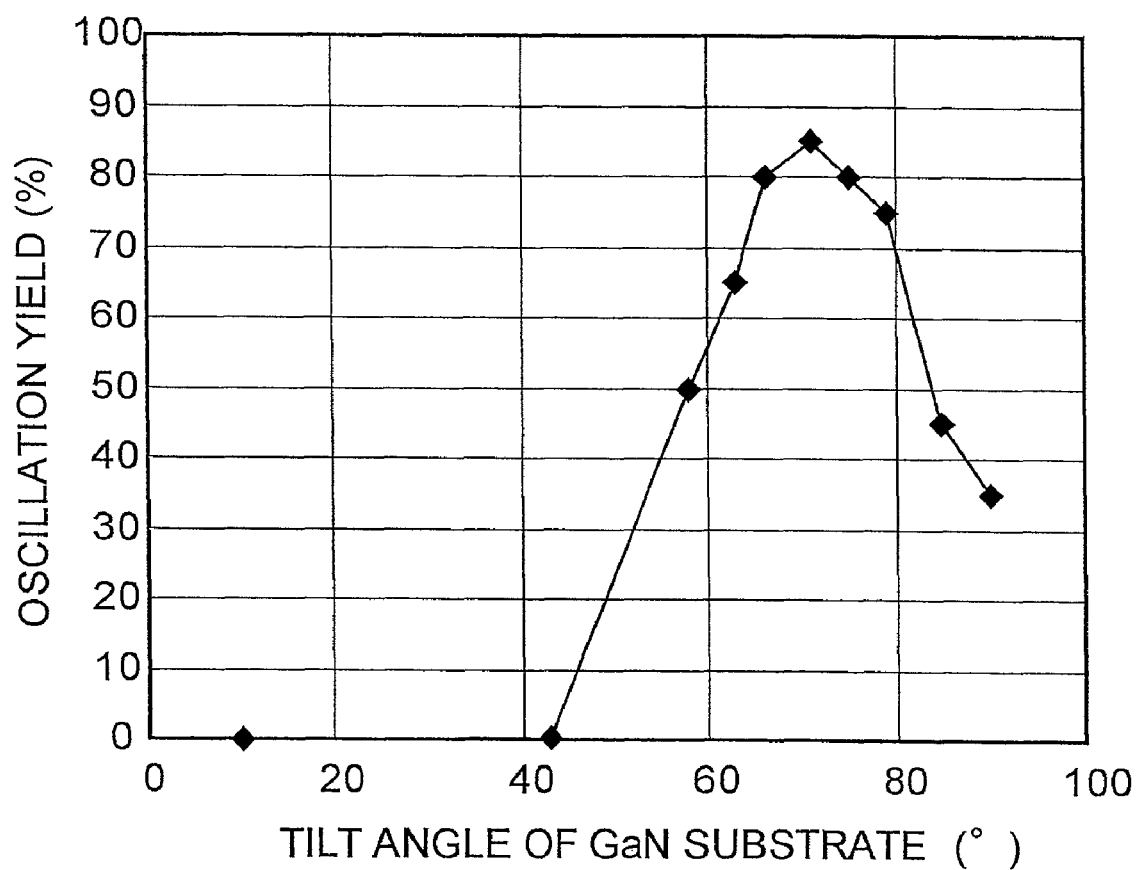
FIG. 10 is a drawing showing a relation of tilt angles of the c-axis toward the m-axis of GaN substrate versus lasing yield.

The relation between the tilt angle of the c-axis of the GaN substrate toward the m-axis, and lasing yield is investigated, and the result thus obtained is shown in FIG. 10. In the present example, the lasing yield is defined as (the number of oscillating chips)/(the number of measured chips). FIG. 10 is a plot for substrates, having the stacking fault density of substrate of not more than $1 \times 10^4$ ($cm^{-1}$), on which lasers with the laser stripe along (1) the M-direction are formed. As seen from FIG. 10, the lasing yield is extremely low in the off angles of not more than 45°. The observation of the end faces with an optical microscope finds that an m-plane is formed in almost all chips at the tilt angles smaller than 45°, resulting in failure in achieving perpendicularity. The observation also finds that when the off angle is in the range of not less than 63° and not more than 80°, the perpendicularity is improved and the lasing yield increases to 50% or more. From these experimental results, the optimum range of off angle of the GaN substrate is not less than 63° and not more than 80°. The same result is also obtained in the range of not less than 100° and not more than 117°, which is an angular range to provide crystallographically equivalent end faces. The data shown in FIG. 10 is as follows.

| Tilt angle, | Yield, |
|---|---|
| 10, | 0.1; |
| 43, | 0.2; |
| 58, | 50; |
| 63, | 65; |
| 66, | 80; |
| 71, | 85; |
| 75, | 80; |
| 79, | 75; |
| 85, | 45; |
| 90, | 35. |

Figure 11:
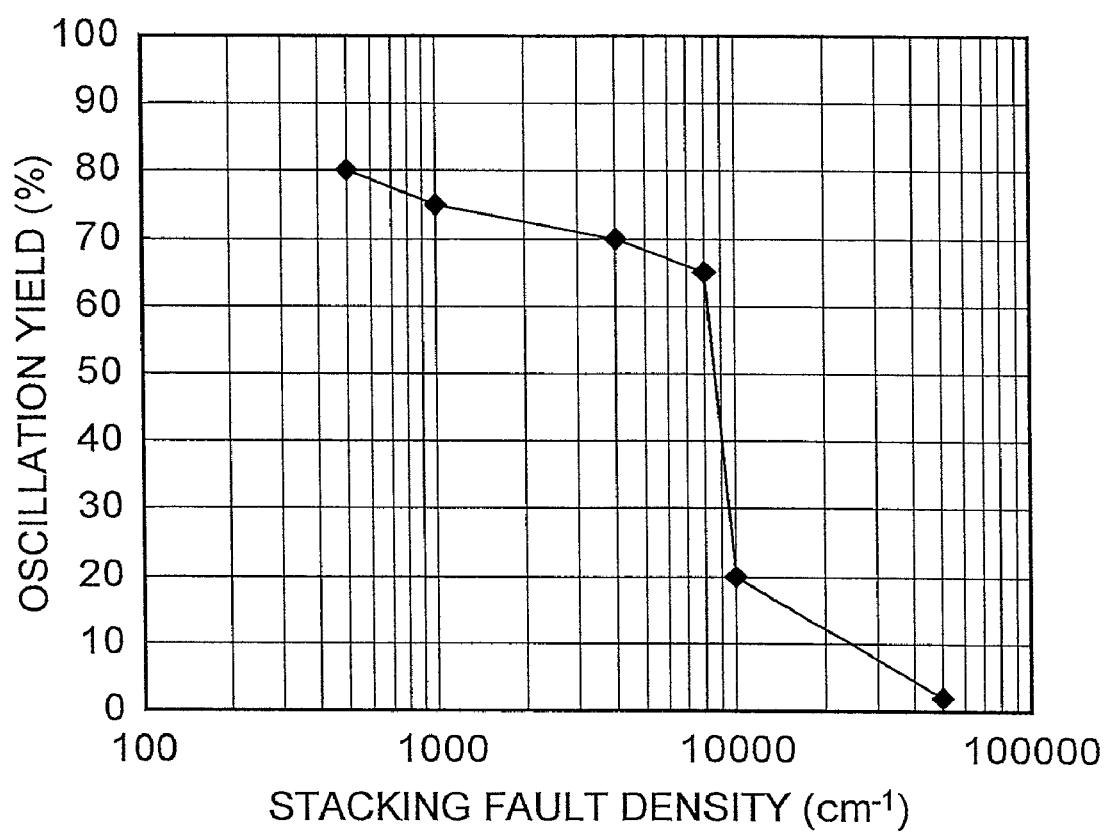
FIG. 11 is a drawing showing a relation of stacking fault density versus lasing yield.

The relation between stacking fault density and lasing yield is investigated and the result obtained is shown in FIG. 11. The definition of lasing yield is the same as above. As seen from FIG. 11, the lasing yield is suddenly decreased with the stacking fault density over $1 \times 10^4$ ($cm^{-1}$). The observation of the end face state with an optical microscope shows that devices in the sample group categorized as decreased lasing yield exhibits the significant unevenness of the end faces, so that no flat fractured faces are obtained. The reason therefor is that a difference in easiness of fracture depends on the existence of stacking faults. From this result, the stacking fault density in the substrate is preferably not more than $1 \times 10^4$ ($cm^{-1}$). The data shown in FIG. 11 is as follows.

| Stacking fault density (cm$^{-1}$), | Yield, |
|---|---|
| 500, | 80; |
| 1000, | 75; |
| 4000, | 70; |
| 8000, | 65; |
| 10000, | 20; |
| 50000, | 2. |

Figure 12:
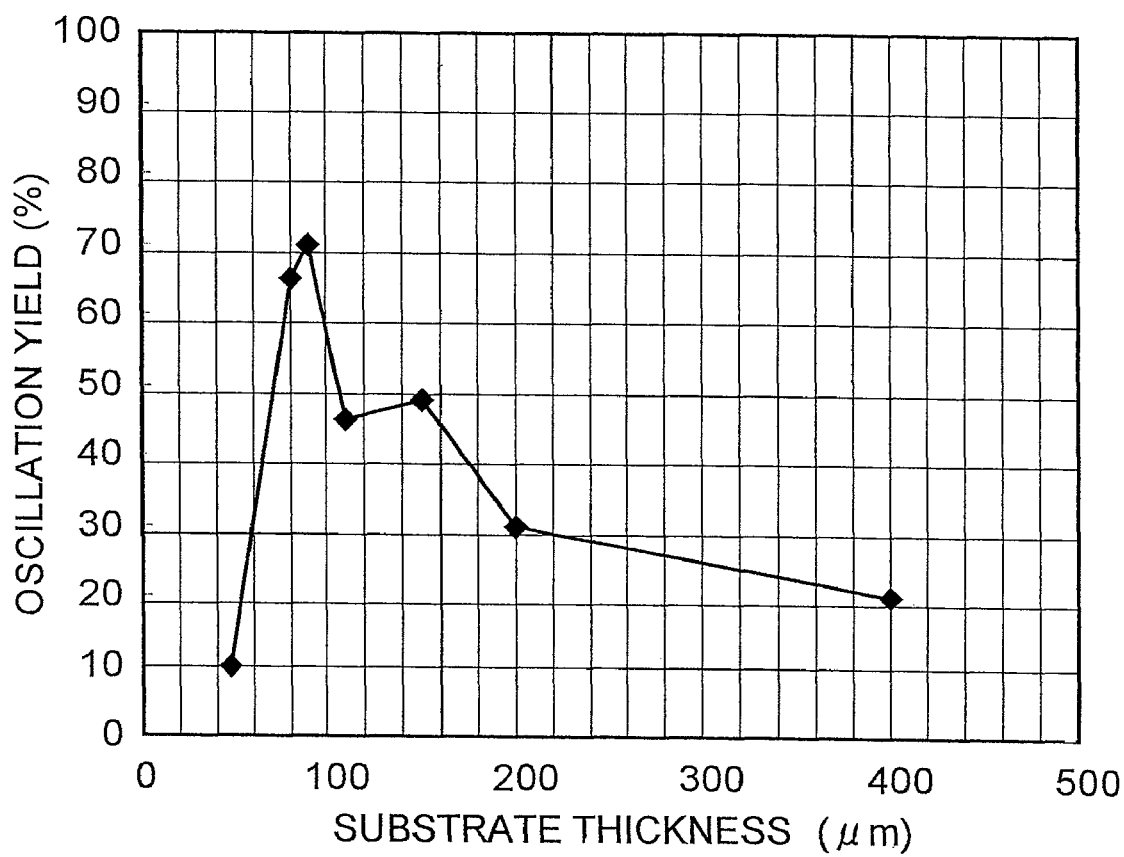
FIG. 12 is a drawing showing a relation of substrate thickness versus lasing yield.

The relation between substrate thickness and lasing yield is investigated, and the result obtained is shown in FIG. 12. The definition of lasing yield is the same as above. FIG. 12 is a plot for laser devices in which the stacking fault density of the substrate is not more than 1×10$^4$ (cm$^{-1}$) and the laser stripe extends along (1) the M-direction. From FIG. 12, the lasing yield is high when the substrate thickness is smaller than 100 μm and larger than 50 μm. When the substrate thickness is larger than 100 μm, the perpendicularity of fractured faces becomes deteriorated. When the thickness is smaller than 50 μm, handling of substrates does not become easy and the semiconductor chips become easy to break. From these, the optimum thickness of the substrate is in a range of not less than 50 μm and not more than 100 μm. The data shown in FIG. 12 is as follows.

| Substrate thickness, | Yield, |
|---|---|
| 48, | 10; |
| 80, | 65; |
| 90, | 70; |
| 110, | 45; |
| 150, | 48; |
| 200, | 30; |
| 400, | 20. |

Example 3

In Example 2, the plurality of epitaxial films for the semiconductor laser are grown on the GaN substrate having the {20-21} surface. As described above, the end faces for the optical cavity are formed through the formation of scribed grooves and by press. In order to find candidates for these end faces, plane orientations different from the a-plane and making an angle near 90° with respect to the (20-21) plane are obtained by calculation. With reference to FIG. 13, the following angles and plane orientations have angles near 90° with respect to the (20-21) plane.

| Specific plane index, | Angle to {20-21} plane, |
|---|---|
| (-1016): | 92.46°; |
| (-1017): | 90.10°; |
| (-1018): | 88.29°. |

Figure 14:
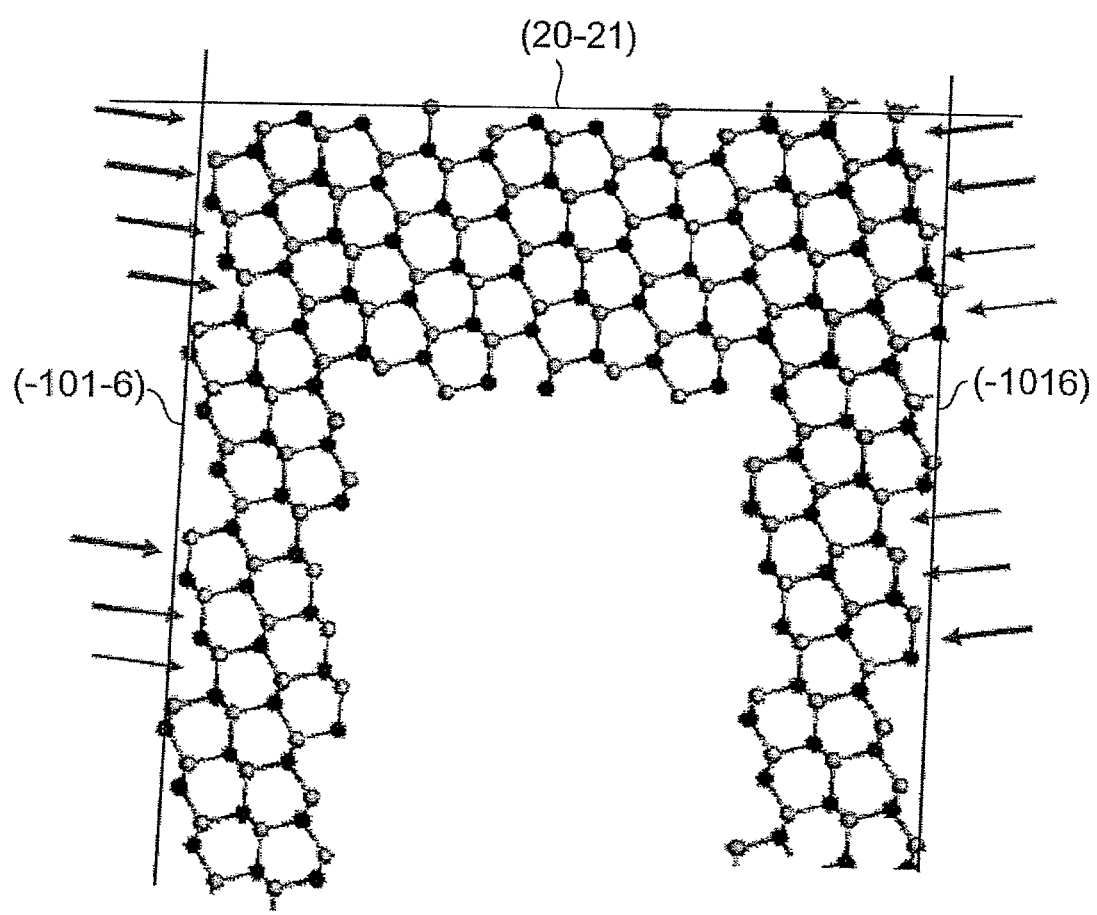
FIG. 14 is a drawing showing atomic arrangements in (20-21) plane, (−101-6) plane, and (−1016) plane.
Figure 15:
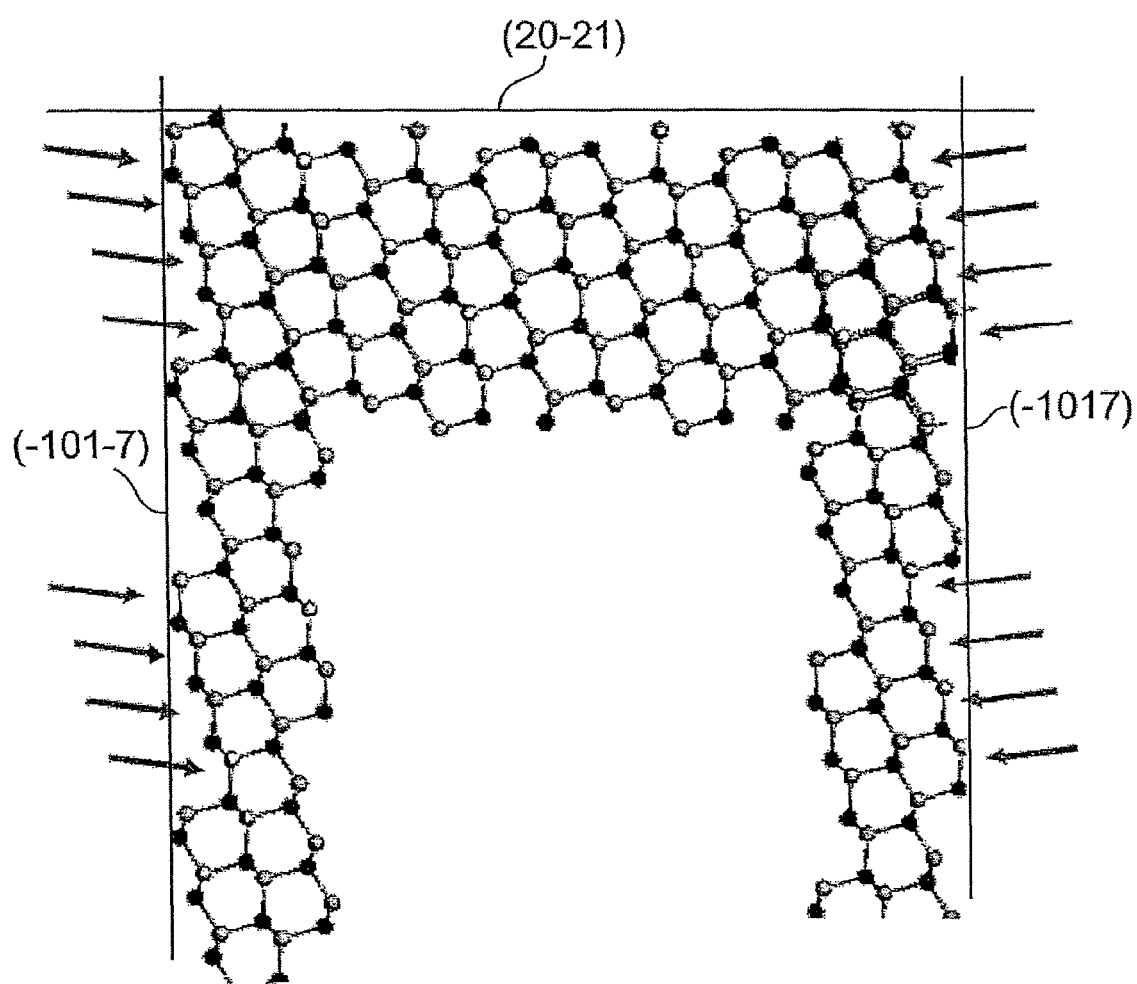
FIG. 15 is a drawing showing atomic arrangements in (20-21) plane, (−101-7) plane, and (−1017) plane.
Figure 16:
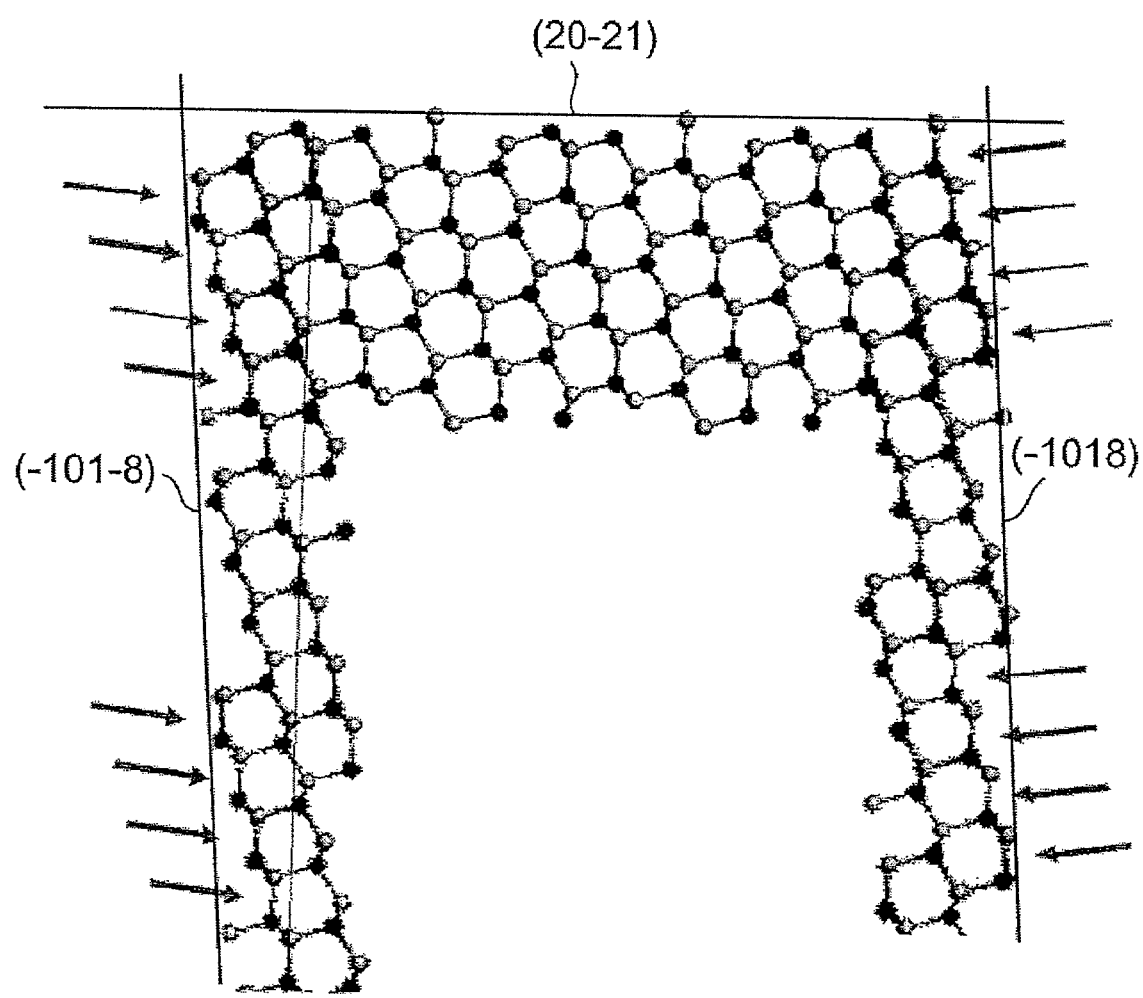
FIG. 16 is a drawing showing atomic arrangements in (20-21) plane, (−101-8) plane, and (−1018) plane.

FIG. 14 is a drawing showing atomic arrangements in the (20-21) plane, (-101-6) plane, and (-1016) plane. FIG. 15 is a drawing showing atomic arrangements in the (20-21) plane, (-101-7) plane, and (-1017) plane. FIG. 16 is a drawing showing atomic arrangements in the (20-21) plane, (-101-8) plane, and (-1018) plane. As shown in FIGS. 14 to 16, local atom arrangements indicated by arrows show configurations of atoms with charge neutrality, and electrically neutral arrangements of atoms appear periodically. The reason why the near-vertical faces with respect to the grown surface are obtained can be that creation of fractured faces is considered to be relatively stable because of the periodic appearance of the neutral atomic configurations in terms of charge.

According to various experiments containing the above-described Examples 1 to 3, the angle ALPHA can be in the range of not less than 45° and not more than 80° or in the range of not less than 100° and not more than 135°. In order to improve the oscillating yield, the angle ALPHA can be in the range of not less than 63° and not more than 80° or in the range of not less than 100° and not more than 117°. The typical semipolar primary surface can be any one of the {20-21} plane, {10-11} plane, {20-2-1} plane, and {10-1-1} plane. Furthermore, the primary surface can be a slight tilt surface from these semipolar planes. For example, the semipolar primary surface can be a slight tilt surface off in the range of not less than -4° and not more than +4° toward the m-plane with respect to any one of the {20-21} plane, {10-11} plane, {20-2-1} plane, and {10-1-1} plane.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

LIST OF REFERENCE SYMBOLS

11: group-III nitride semiconductor laser device;
13: laser structure;
13*a*: first surface;
13*b*: second surface;
13*c*, 13*d*: edges;
15: electrode;
17: support base;
17*a*: semipolar primary surface;
17*b*: back surface of support base;
17*c*: end face of support base;
19: semiconductor region;
19*a*: surface of semiconductor region;
19*c*: end face of semiconductor region;
21: first cladding layer;
23: second cladding layer;
25: active layer;
25*a*: well layers;
25*b*: barrier layers;
27, 29: fractured faces;
ALPHA: angle;
Sc: c-plane;
NX: normal axis;
31 insulating film;
31*a*: aperture of insulating film;
35: n-side optical guide layer;
37: p-side optical guide layer;
39: carrier block layer;
41: electrode;
43*a*, 43*b*: dielectric multilayer films;
MA: m-axis vector;
BETA: angle;
DSUB: thickness of support base;
51: substrate;
51*a*: semipolar primary surface;
SP: substrate product;
57: GaN-based semiconductor region;
59: light emitting layer;
61: GaN-based semiconductor region;
53: semiconductor region;

54: insulating film;
54a: aperture of insulating film;
55: laser structure;
58a: anode electrode;
58b: cathode electrode;
63a: first surface;
63b: second surface;
10a: laser scriber;
65a: scribed groove;
65b: scribed groove;
LB: laser beam;
SP1: substrate product;
LB1: laser bar;
69: blade;
69a edge;
69b, 69c: blade face;
71: support device;
71a: support table;
71b: recess.

The invention claimed is:

1. A group-III nitride semiconductor laser device comprising:
 a laser structure including a support base and a semiconductor region, the support base comprising a hexagonal group-III nitride semiconductor and having a semipolar primary surface, and the semiconductor region being provided on the semipolar primary surface of the support base; and
 an electrode provided on the semiconductor region of the laser structure,
 the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer,
 the first cladding layer, the second cladding layer, and the active layer being arranged along a normal axis to the semipolar primary surface,
 the active layer including a gallium nitride-based semiconductor layer,
 a c-axis of the hexagonal group-III nitride semiconductor of the support base tilting at a finite angle ALPHA with respect to a normal axis toward an m-axis of the hexagonal group-III nitride semiconductor, the angle ALPHA between the normal axis and the c-axis of the hexagonal group-III nitride semiconductor falling within the range of not less than 45° and not more than 80° or within the range of not less than 100° and not more than 135°,
 the laser structure including first and second fractured faces, the first and second fractured faces intersecting with an m-n plane defined by the normal axis and the m-axis of the hexagonal group-III nitride semiconductor,
 a laser cavity of the group-III nitride semiconductor laser device including the first and second fractured faces,
 the laser structure including first and second surfaces and the first surface is opposite to the second surface, and
 each of the first and second fractured faces extending from an edge of the first surface to an edge of the second surface,
 an end face of the support base and an end face of the semiconductor region being exposed in each of the first and second fractured faces,
 an angle between the end face of the active layer in the semiconductor region and a reference plane perpendicular to the m-axis of the support base of the hexagonal nitride semiconductor being in the range of not less than (ALPHA-5)° and not more than (ALPHA+5)° in a first plane, the first plane being defined by the c-axis and the m-axis of the group-III nitride semiconductor,
 the angle being in the range of not less than −5° and not more than +5° on a second plane perpendicular to the first plane and the normal axis, and
 an electrically neutral arrangement of atoms appearing periodically in each of the first and second fractured faces.

2. The group-III nitride semiconductor laser device according to claim 1, wherein the angle between the normal axis and the c-axis of the hexagonal group-III nitride semiconductor falls within the range of not less than 63° and not more than 80° or within the range of not less than 100° and not more than 117°.

3. The group-III nitride semiconductor laser device according to claim 1, wherein a thickness of the support base is not more than 400 μm.

4. The group-III nitride semiconductor laser device according to claim 1, wherein a thickness of the support base is not less than 50 μm and not more than 100 μm.

5. The group-III nitride semiconductor laser device according to claim 1, wherein laser light from the active layer is polarized in a direction of an a-axis of the hexagonal group-III nitride semiconductor.

6. The group-III nitride semiconductor laser device according to claim 1, wherein light in an LED mode of the group-III nitride semiconductor laser device includes a polarization component I1 in a direction of an a-axis of the hexagonal group-III nitride semiconductor, and a polarization component I2 in a direction indicated by a projection of the c-axis of the hexagonal group-III nitride semiconductor onto the primary surface, and
 wherein the polarization component I1 is greater than the polarization component I2.

7. The group-III nitride semiconductor laser device according to claim 1, wherein the semipolar primary surface is slightly tilted in the range of not less than −4° and not more than +4° with respect to any one of a {20-21} plane, a {10-11} plane, a {20-2-1} plane, and a {10-1-1} plane.

8. The group-III nitride semiconductor laser device according to claim 1, wherein the semipolar primary surface is one of a {20-21} plane, a {10-11} plane, a {20-2-1} plane, and a {10-1-1} plane.

9. The group-III nitride semiconductor laser device according to claim 1, wherein a stacking fault density of the support base is not more than $1\times10^4$ cm$^{-1}$.

10. The group-III nitride semiconductor laser device according to claim 1, wherein the support base comprise any one of GaN, AlGaN, AlN, InGaN, and InAlGaN.

11. The group-III nitride semiconductor laser device according to claim 1, further comprising a dielectric multilayer film provided on at least one of the first and second fractured faces.

12. The group-III nitride semiconductor laser device according to claim 1, wherein the active layer includes a light emitting region provided so as to generate light at a wavelength of not less than 360 nm and not more than 600 nm.

13. The group-III nitride semiconductor laser device according to claim 1, wherein the active layer includes a quantum well structure provided so as to generate light at a wavelength of not less than 430 nm and not more than 550 nm.

14. A method of fabricating a group-III nitride semiconductor laser device, the method comprising the steps of:

preparing a substrate of a hexagonal group-III nitride semiconductor, the substrate having a semipolar primary surface;

forming a substrate product having a laser structure, an anode electrode and a cathode electrode, the laser structure including the substrate and a semiconductor region, and the semiconductor region being formed on the semipolar primary surface;

scribing a first surface of the substrate product in part in a direction of the a-axis of the hexagonal group-III nitride semiconductor; and carrying out breakup of the substrate product by press against a second surface of the substrate product, to form another substrate product and a laser bar, the first surface being opposite to the second surface, the semiconductor region being located between the first surface and the substrate, the laser bar having first and second end faces, the first and second end faces being formed by the breakup, and the first and second end faces extending from the first surface to the second surface, the first and second end faces constituting a laser cavity of the group-III nitride semiconductor laser device, the anode electrode and the cathode electrode being formed on the laser structure, the semiconductor region comprising a first cladding layer of a first conductivity type gallium nitride-based semiconductor, a second cladding layer of a second conductivity type gallium nitride-based semiconductor and an active layer, the active layer being provided between the first cladding layer and the second cladding layer, the first cladding layer, the second cladding layer, and the active layer being arranged along a normal axis to the semipolar primary surface, the active layer comprising a gallium nitride-based semiconductor layer, a c-axis of the hexagonal group-III nitride semiconductor of the substrate tilting at an angle ALPHA with respect to the normal axis toward the m-axis of the hexagonal group-III nitride semiconductor, and the angle ALPHA falling within a range of not less than 45° and not more than 80° or within the range of not less than 100° and not more than 135°, the first and second end faces intersecting with an m-n plane defined by the normal axis and the m-axis of the hexagonal group-III nitride semiconductor, an end face of the active layer in each of the first and second end faces making an angle in the range of not less than (ALPHA-5)° and not more than (ALPHA+5)° with respect to a reference plane in a plane, the plane being defined by the c-axis and the m-axis of the hexagonal group-III nitride semiconductor, and the reference plane being perpendicular to the m-axis of the support base of the hexagonal nitride semiconductor, and an electrically neutral arrangement of atoms appearing periodically in each of the first and second end faces.

15. The method according to claim 14, wherein the angle ALPHA falls within a range of not less than 63° and not more than 80° or within a range of not less than 100° and not more than 117°.

16. The method according to claim 14,
wherein the step of forming the substrate product comprises performing processing such as slicing or grinding of the substrate so that a thickness of the substrate becomes not more than 400 μm, and
wherein the second surface is one of the following: a processed surface formed by the processing; and a surface including an electrode formed on the processed surface.

17. The method according to claim 14,
wherein the step of forming the substrate product comprises polishing the substrate so that a thickness of the substrate becomes not less than 50 μm and not more than 100 μm, and
wherein the second surface is one of the following: a polished surface formed by the polishing; and a surface including an electrode formed on the polished surface.

18. The method according to claim 14,
wherein the scribing is carried out using a laser scriber, and
wherein the scribing forms a scribed groove, and a length of the scribed groove is shorter than a length of an intersecting line between the first surface and an a-n plane defined by the normal axis and an a-axis of the hexagonal group-III nitride semiconductor.

19. The method according to claim 14,
wherein the semipolar primary surface is any one of a {20-21} plane, a {10-11} plane, a {20-2-1} plane, and a {10-1-1} plane.

20. The method according to claim 14, wherein the substrate comprises any one of GaN, AlGaN, AlN, InGaN, and InAlGaN.

* * * * *